US012055860B2

(12) United States Patent
Lee et al.

(10) Patent No.: US 12,055,860 B2
(45) Date of Patent: Aug. 6, 2024

(54) MULTI-FUNCTION OVERLAY MARKS FOR REDUCING NOISE AND EXTRACTING FOCUS AND CRITICAL DIMENSION INFORMATION

(71) Applicant: Taiwan Semiconductor Manufacturing Co., Ltd., Hsinchu (TW)

(72) Inventors: Yu-Ching Lee, Kaohsiung (TW); Te-Chih Huang, Hsinchu (TW); Yu-Piao Fang, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 18/366,097

(22) Filed: Aug. 7, 2023

(65) Prior Publication Data

US 2024/0012340 A1    Jan. 11, 2024

Related U.S. Application Data

(60) Continuation of application No. 17/816,030, filed on Jul. 29, 2022, now Pat. No. 11,835,864, which is a continuation of application No. 17/171,119, filed on Feb. 9, 2021, now Pat. No. 11,448,975, which is a division of application No. 16/026,309, filed on Jul. 3, 2018, now Pat. No. 10,915,017.

(60) Provisional application No. 62/552,536, filed on Aug. 31, 2017.

(51) Int. Cl.
| G03F 7/00 | (2006.01) |
| G03F 1/22 | (2012.01) |
| G03F 1/24 | (2012.01) |
| G03F 1/42 | (2012.01) |
| H01L 23/544 | (2006.01) |

(52) U.S. Cl.
CPC ............ *G03F 7/70633* (2013.01); *G03F 1/22* (2013.01); *G03F 1/24* (2013.01); *G03F 1/42* (2013.01); *H01L 23/544* (2013.01); *H01L 2223/54426* (2013.01)

(58) Field of Classification Search
CPC ..... G03F 1/22; G03F 1/24; G03F 1/42; G03F 7/70633; H01L 23/544; H01L 2223/54426
USPC .............................................. 430/5; 257/797
See application file for complete search history.

(56) References Cited

U.S. PATENT DOCUMENTS

| 8,628,897 | B1 | 1/2014 | Lu et al. |
| 8,679,707 | B2 | 3/2014 | Lee et al. |
| 8,691,476 | B2 | 4/2014 | Yu et al. |
| 8,709,682 | B2 | 4/2014 | Chen et al. |
| 8,715,890 | B2 | 5/2014 | Tu et al. |
| 8,722,286 | B2 | 5/2014 | Yu et al. |
| 8,753,788 | B1 | 6/2014 | Yu et al. |
| 8,764,995 | B2 | 7/2014 | Chang et al. |
| 8,765,330 | B2 | 7/2014 | Shih et al. |
| 8,765,582 | B2 | 7/2014 | Hsu et al. |
| 8,785,084 | B2 | 7/2014 | Lu et al. |
| 8,828,625 | B2 | 9/2014 | Lu et al. |
| 8,841,047 | B2 | 9/2014 | Yu et al. |
| 8,877,409 | B2 | 11/2014 | Hsu et al. |
| 9,482,964 | B2 | 11/2016 | Liou et al. |
| 2005/0195398 | A1 | 9/2005 | Adel et al. |
| 2013/0200535 | A1 | 8/2013 | Chen et al. |
| 2013/0202992 | A1 | 8/2013 | Chen et al. |
| 2015/0286146 | A1 | 10/2015 | Chang et al. |
| 2015/0309405 | A1 | 10/2015 | Shih et al. |
| 2015/0311075 | A1 | 10/2015 | Huang et al. |
| 2016/0061589 | A1 | 3/2016 | Bhattachryya et al. |

FOREIGN PATENT DOCUMENTS

| CN | 101266937 A | 9/2008 |
| KR | 20010066288 | 7/2001 |
| KR | 20070058374 | 6/2007 |
| KR | 20090044584 | 5/2009 |
| KR | 20110001804 | 1/2011 |
| TW | 201539159 A | 10/2015 |
| WO | WO2011026055 | 3/2011 |
| WO | WO2016030255 | 3/2016 |

*Primary Examiner* — Christopher G Young
(74) *Attorney, Agent, or Firm* — HAYNES AND BOONE, LLP

(57) ABSTRACT

An overlay mark includes a first, a second, a third, and a fourth component. The first component is located in a first region of the first overlay mark and includes a plurality of gratings that extend in a first direction. The second component is located in a second region of the first overlay mark and includes a plurality of gratings that extend in the first direction. The third component is located in a third region of the first overlay mark and includes a plurality of gratings that extend in a second direction different from the first direction. The fourth component is located in a fourth region of the first overlay mark and includes a plurality of gratings that extend in the second direction. The first region is aligned with the second region. The third region is aligned with the fourth region.

20 Claims, 32 Drawing Sheets

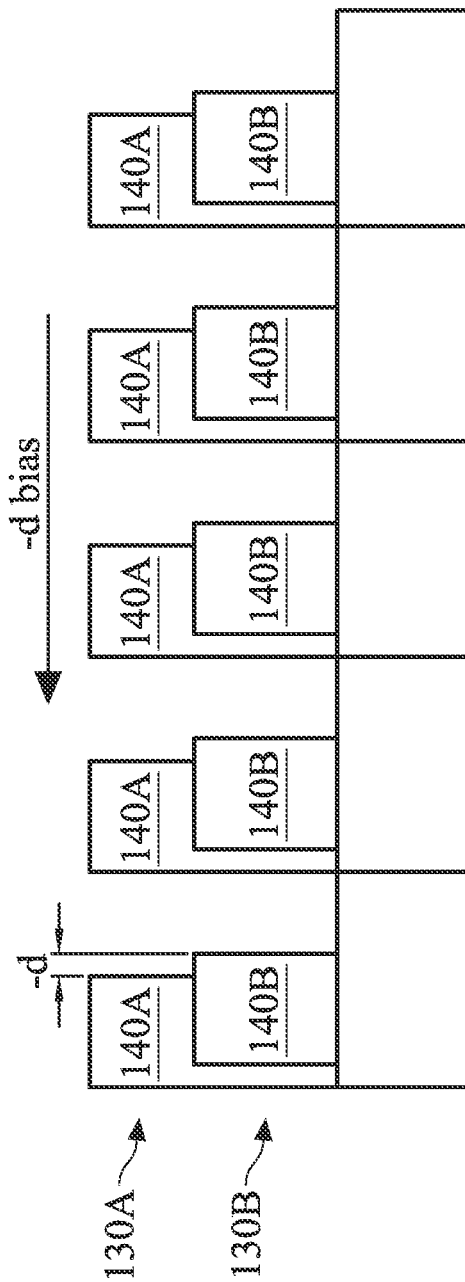
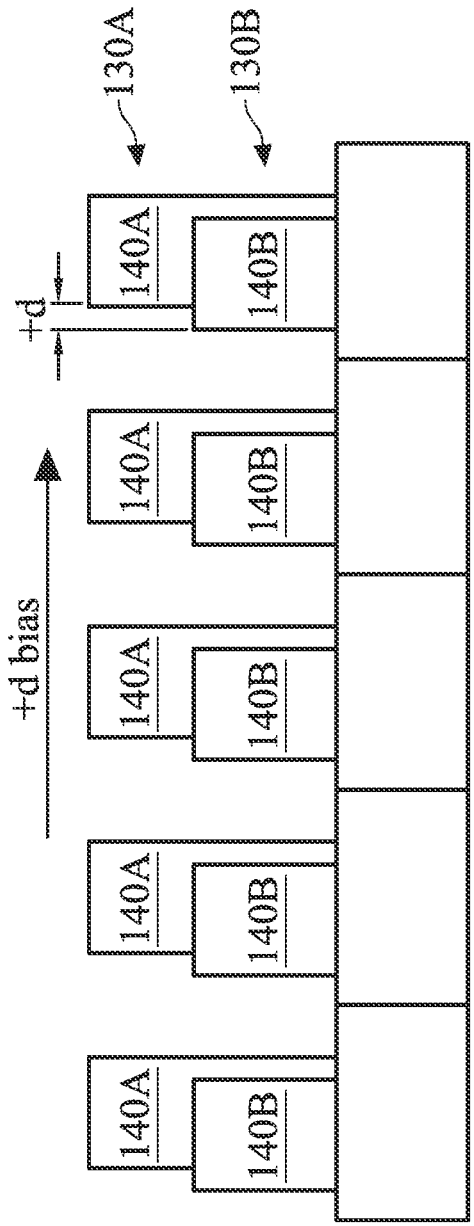
FIG. 4A
FIG. 4B

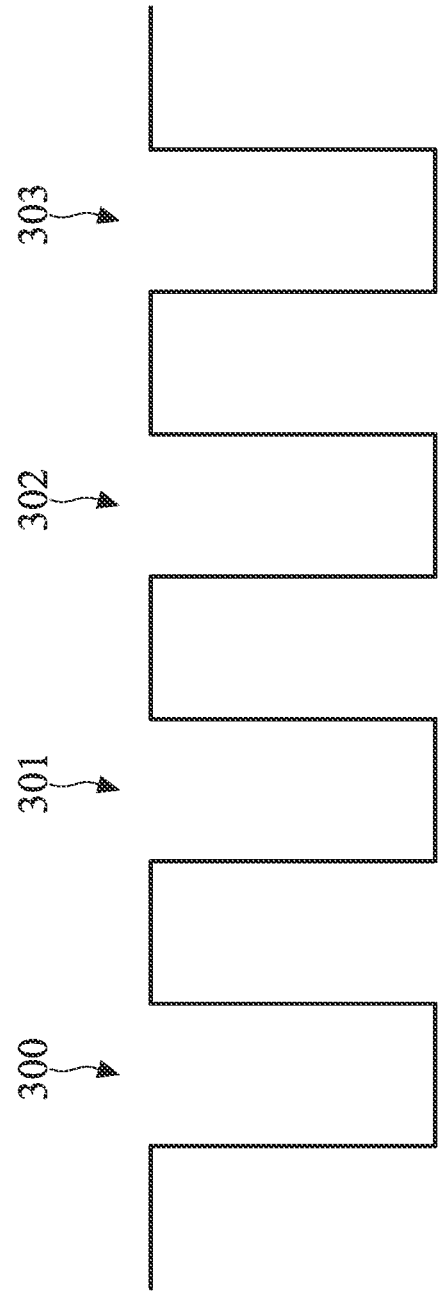
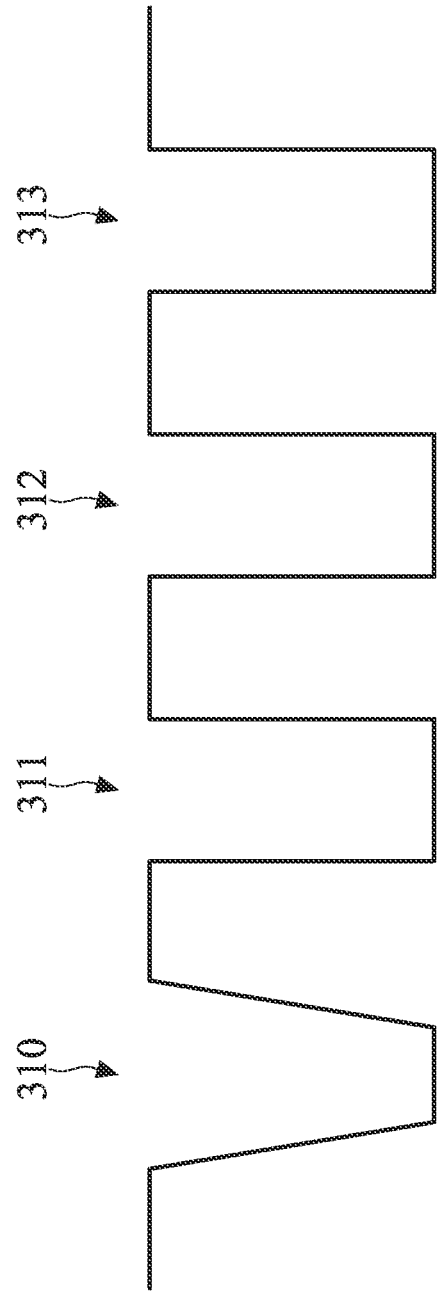
FIG. 7A
FIG. 7B

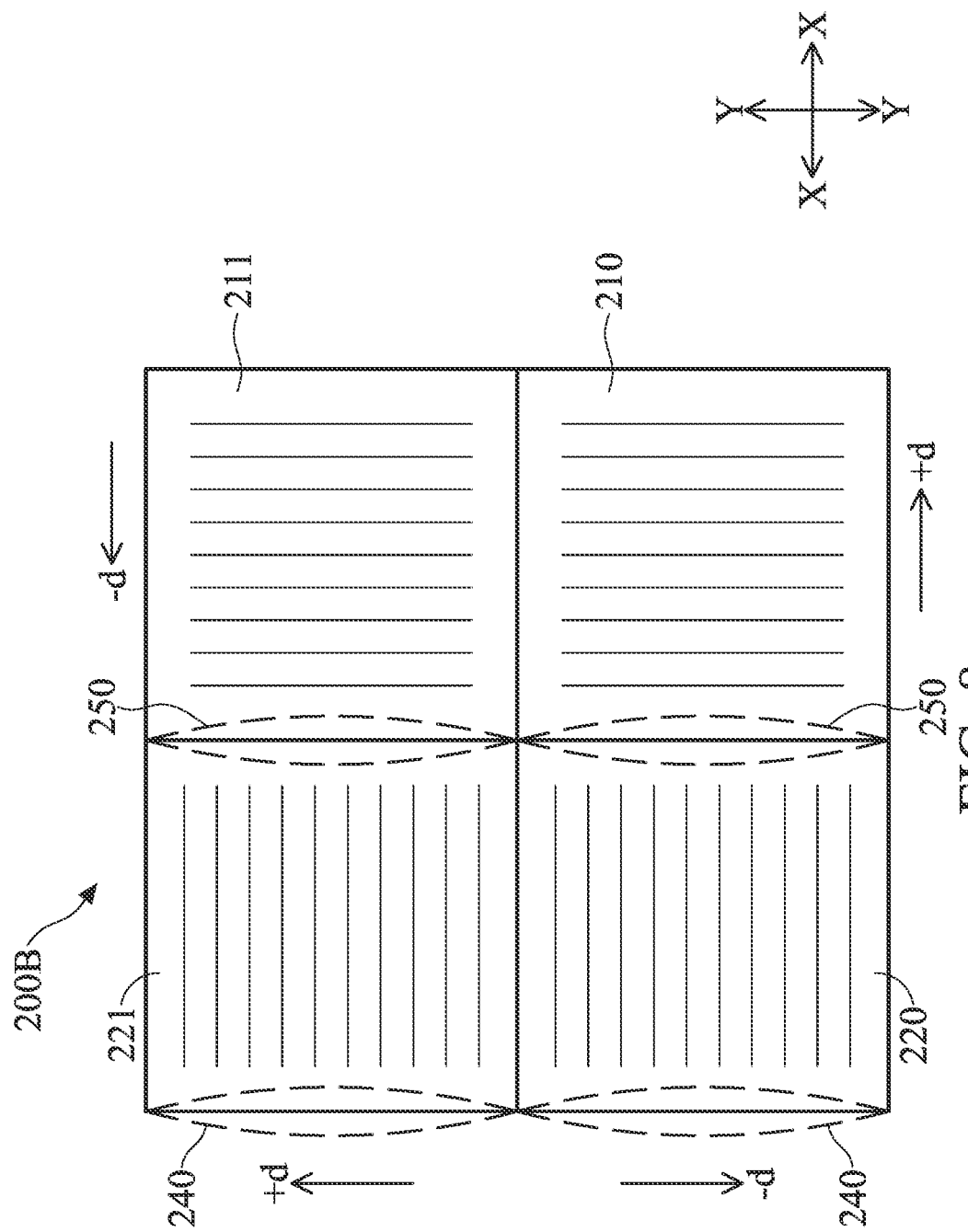

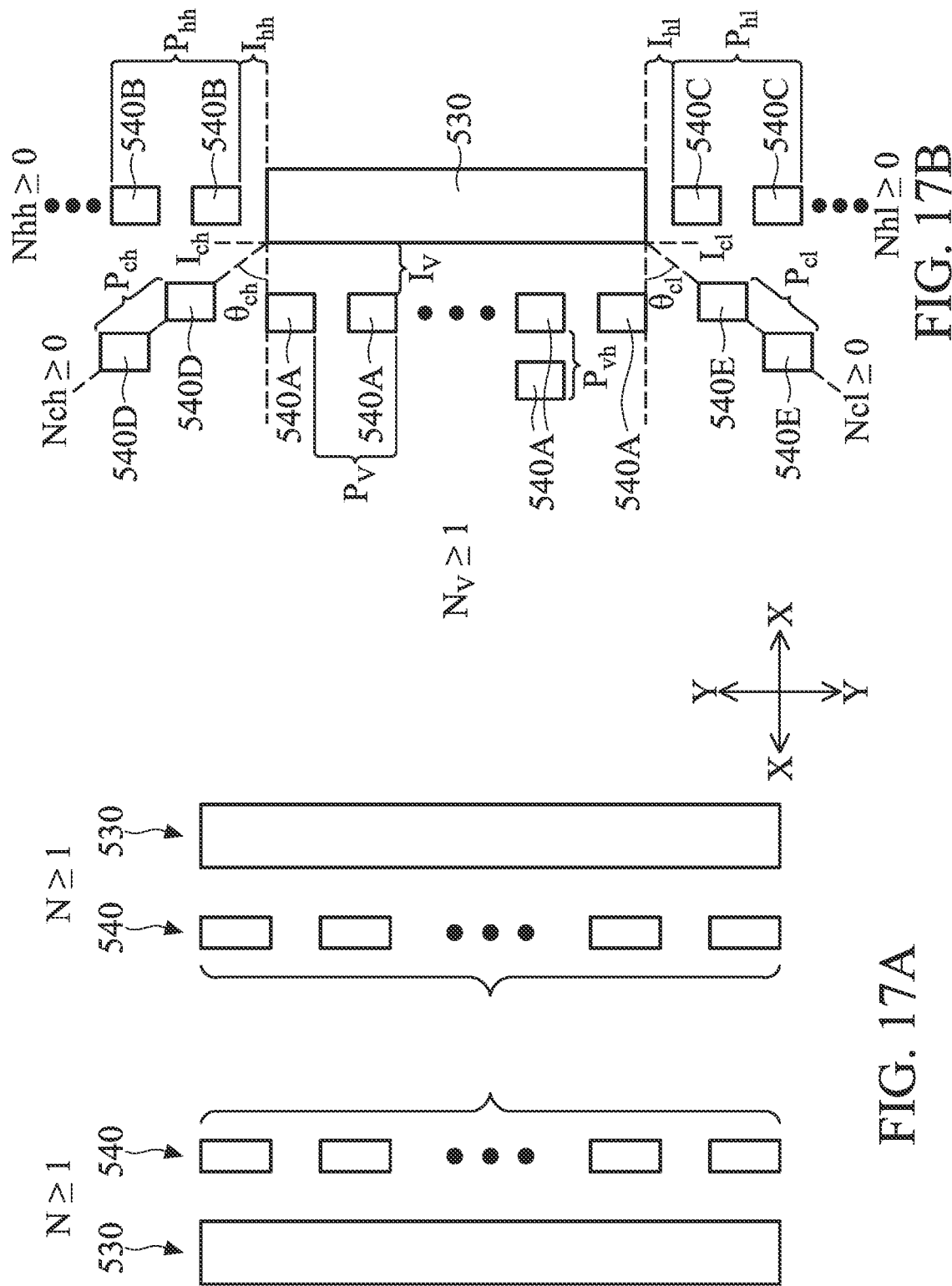

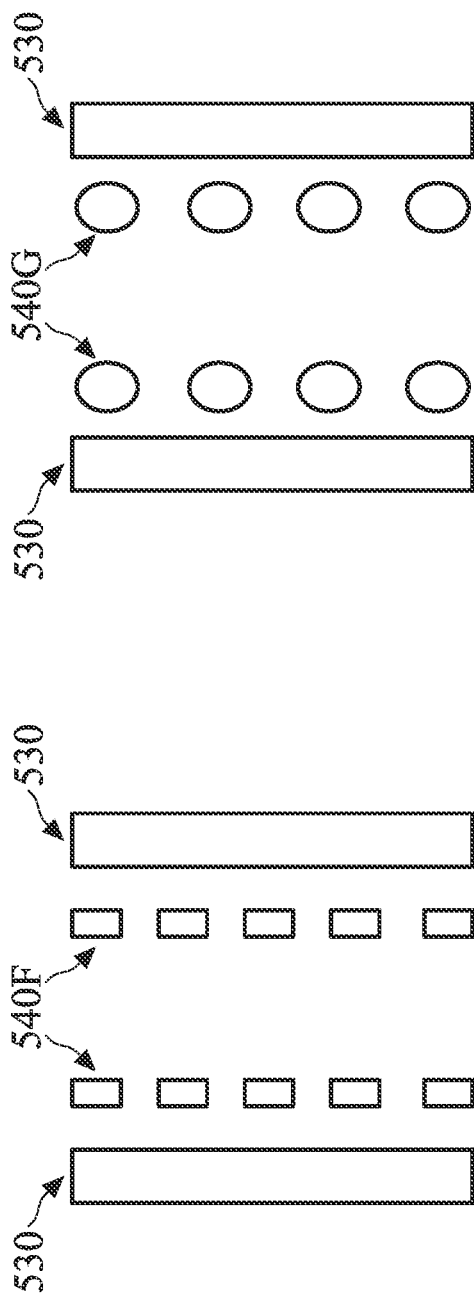
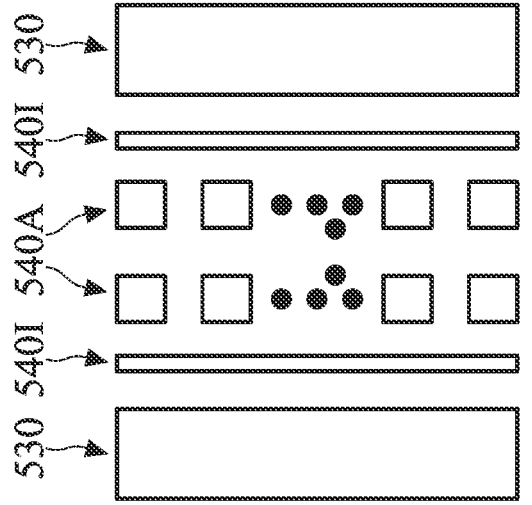
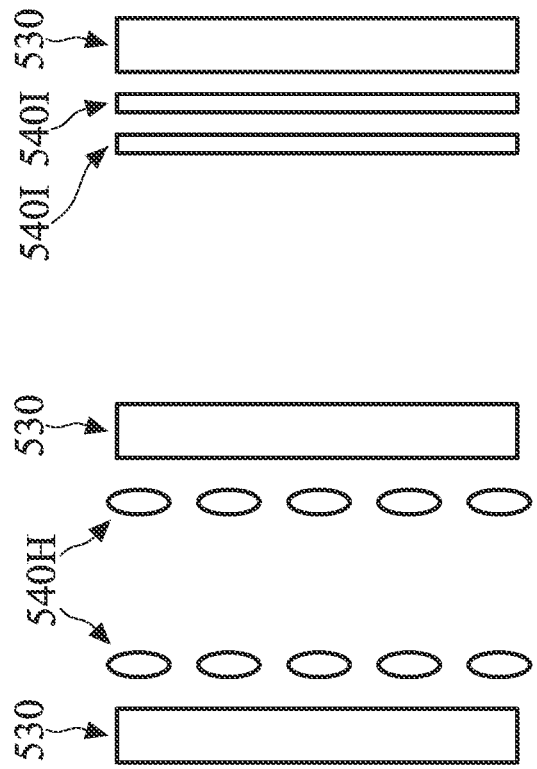

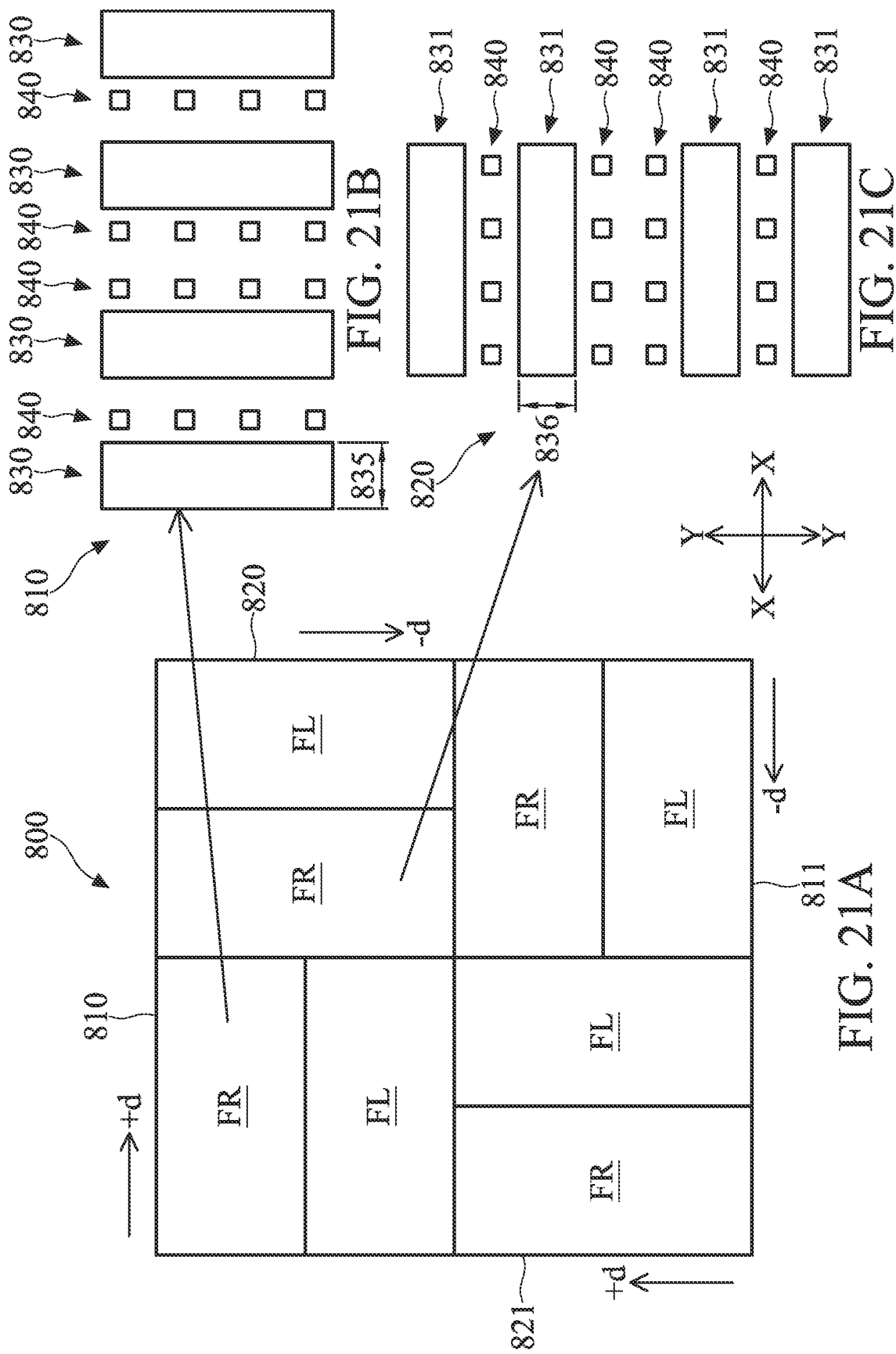

1700

1710 — Patterning an overlay mark on a wafer, wherein the overlay mark includes: a plurality of first gratings disposed in a first layer of the overlay mark; a plurality of second gratings disposed in a second layer of the overlay mark, wherein one of the first layer and the second layer includes an upper layer, and another one of the first layer and the second layer includes a lower layer disposed below the upper layer; and a plurality of sub-patterns disposed in the first layer, but not in the second layer, wherein a size of each of the first gratings is at least an order of magnitude larger than each of the sub-patterns.

1720 — Performing one or more semiconductor manufacturing processes using the overlay mark

FIG. 26

MULTI-FUNCTION OVERLAY MARKS FOR REDUCING NOISE AND EXTRACTING FOCUS AND CRITICAL DIMENSION INFORMATION

PRIORITY DATA

The present application is a continuation application of U.S. patent application Ser. No. 17/816,030, filed on Jul. 29, 2022, entitled "MULTI-FUNCTION OVERLAY MARKS FOR REDUCING NOISE AND EXTRACTING FOCUS AND CRITICAL DIMENSION INFORMATION", which is a continuation application of U.S. patent application Ser. No. 17/171,119, filed on Feb. 9, 2021, entitled "MULTI-FUNCTION OVERLAY MARKS FOR REDUCING NOISE AND EXTRACTING FOCUS AND CRITICAL DIMENSION INFORMATION", which is a divisional application of U.S. patent application Ser. No. 16/026,309, filed on Jul. 3, 2018, which claims benefit to U.S. Provisional Patent Application No. 62/552,536, filed on Aug. 31, 2017, entitled "MULTI-FUNCTION OVERLAY MARKS FOR MEASURING FOCUS AND CRITICAL DIMENSION (CD) INFORMATION", the disclosures of each which are incorporated herein in their respective entireties.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of integrated circuit evolution, functional density (i.e., the number of interconnected devices per chip area) has generally increased while geometry size (i.e., the smallest component (or line) that can be created using a fabrication process) has decreased.

Overlay marks have been used to measure the overlay or alignment between various layers of an IC. However, conventional overlay marks still have shortcomings. For example, the measurement accuracy of a conventional overlay mark may be affected by the location of the overlay mark, such as the pattern density of the IC features surrounding the overlay mark. As another example, while conventional overlay marks can be used to measure overlay, they have not been able to determine focus or critical dimension (CD) information. Therefore, while existing overlay marks and have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 4A-4B illustrate superimposed simplified fragmentary cross-sectional views of an upper layer 130A and a lower layer 130B in accordance with some embodiments of the present disclosure.

FIGS. 7A-7B each illustrate a cross-sectional profile of a plurality of gratings of an overlay mark FIGS. 8-10 illustrates a top view of an embodiment of an overlay mark on a wafer in accordance with some embodiments of the present disclosure.

FIGS. 17A-17B illustrate fragmentary top views of portions of an overlay mark with sub-patterns in accordance with some embodiments of the present disclosure.

FIGS. 18A-18E illustrate the top views of several example embodiments of sub-patterns in an overlay mark in accordance with some embodiments of the present disclosure

FIGS. 21A, 21B, and 21C illustrate the top views of an overlay mark, in accordance with some embodiments of the present disclosure.

FIGS. 23-26 are flowcharts that illustrate the process flows associated with the overlay marks in accordance with some embodiments of the present disclosure.

DETAILED DESCRIPTION

Figure 1:
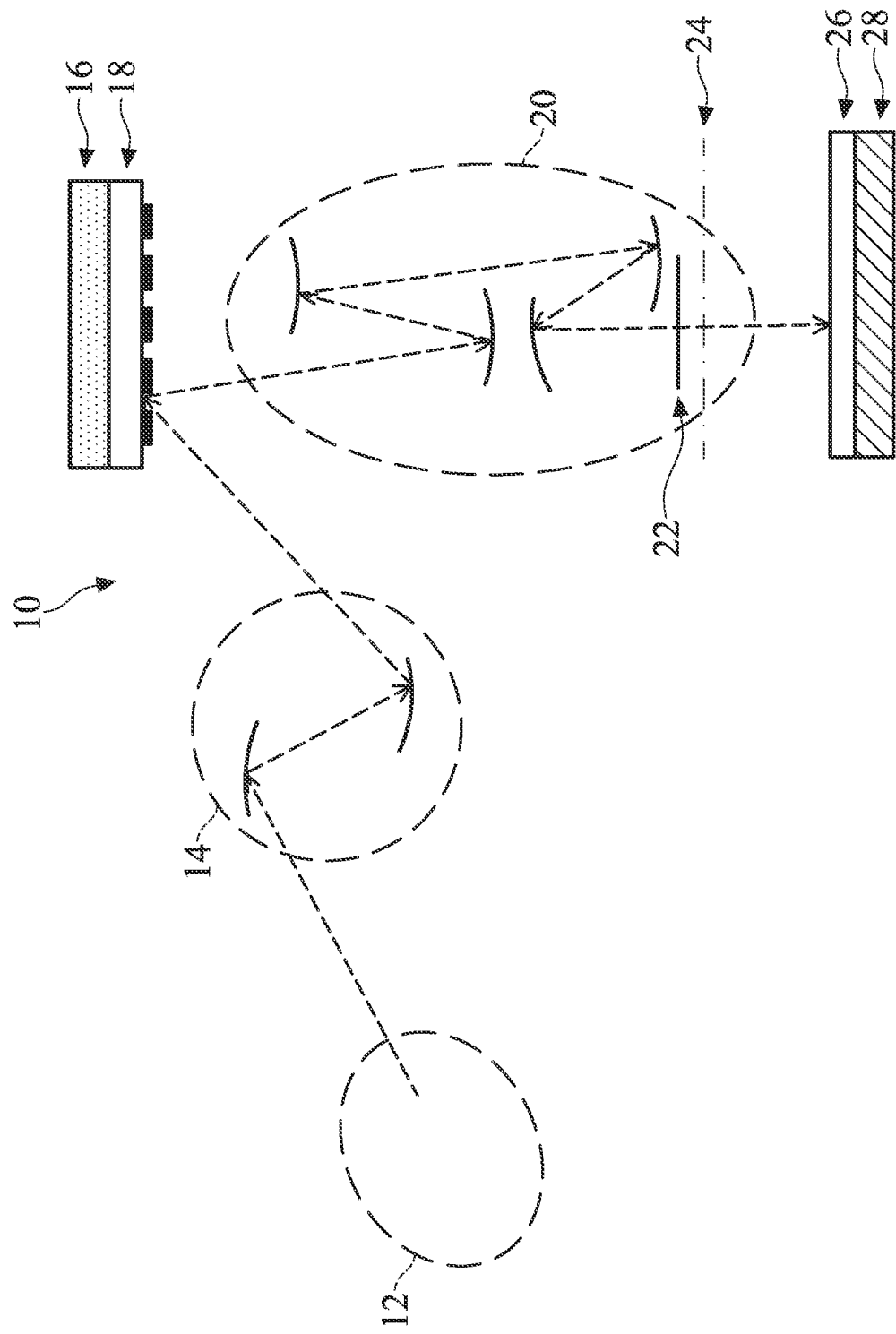
FIG. 1 is a schematic view of a lithography system constructed in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

To ensure accurate alignment (also referred to as overlay) between the various layers in a fabricated semiconductor device, overlay marks (which are different from alignment marks that are used align a mask with a tool stage during lithography) are used to measure the alignment between the layers. However, conventional overlay marks may have shortcomings. For example, conventional overlay marks may be prone to being adversely affected by noise. As another example, conventional overlay marks may not be capable of extracting focus or critical dimension information.

To overcome the problems discussed above, the present disclosure provides embodiments of overlay marks that can reduce noise and also capable of extracting focus and critical dimension information. The various aspects of the present disclosure will be discussed below in greater detail with reference to FIGS. 1-24. First, a EUV lithography system will be discussed below with reference to FIGS. 1-2 as an example lithography context in which the overlay mark of the present disclosure may be used, although it is understood that the overlay mark discussed herein may be used for other types of non-EUV lithography contexts too. Next, the details of the overlay mark according to embodiments of the present disclosure are discussed with reference to FIGS. 3-24.

FIG. 1 is a schematic view diagram of a EUV lithography system 10, constructed in accordance with some embodiments. The EUV lithography system 10 may also be generically referred to as a scanner that is configured to perform lithography exposure processes with respective radiation source and exposure mode. The EUV lithography system 10 is designed to expose a photoresist layer by EUV light or EUV radiation. The photoresist layer is a material sensitive to the EUV light. The EUV lithography system 10 employs a radiation source 12 to generate EUV light, such as EUV light having a wavelength ranging between about 1 nm and about 100 nm. In one particular example, the radiation source 12 generates a EUV light with a wavelength centered at about 13.5 nm. Accordingly, the radiation source 12 is also referred to as EUV radiation source 12.

The lithography system 10 also employs an illuminator 14. In various embodiments, the illuminator 14 includes various refractive optic components, such as a single lens or a lens system having multiple lenses (zone plates) or alternatively reflective optics (for EUV lithography system), such as a single mirror or a mirror system having multiple mirrors in order to direct light from the radiation source 12 onto a mask stage 16, particularly to a mask 18 secured on the mask stage 16. In the present embodiment where the radiation source 12 generates light in the EUV wavelength range, the illuminator 14 employs reflective optics. In some embodiments, the illuminator 14 includes a dipole illumination component.

In some embodiments, the illuminator 14 is operable to configure the mirrors to provide a proper illumination to the mask 18. In one example, the mirrors of the illuminator 14 are switchable to reflect EUV light to different illumination positions. In some embodiment, a stage prior to the illuminator 14 may additionally include other switchable mirrors that are controllable to direct the EUV light to different illumination positions with the mirrors of the illuminator 14. In some embodiments, the illuminator 14 is configured to provide an on-axis illumination (ONI) to the mask 18. In an example, a disk illuminator 14 with partial coherence σ being at most 0.3 is employed. In some other embodiments, the illuminator 14 is configured to provide an off-axis illumination (OAI) to the mask 18. In an example, the illuminator 14 is a dipole illuminator. The dipole illuminator has a partial coherence σ of at most 0.3 in some embodiments.

The lithography system 10 also includes a mask stage 16 configured to secure a mask 18. In some embodiments, the mask stage 16 includes an electrostatic chuck (e-chuck) to secure the mask 18. This is because gas molecules absorb EUV light, and the lithography system for the EUV lithography patterning is maintained in a vacuum environment to avoid the EUV intensity loss. In the disclosure, the terms of mask, photomask, and reticle are used interchangeably to refer to the same item.

In the present embodiment, the lithography system 10 is a EUV lithography system, and the mask 18 is a reflective mask. One exemplary structure of the mask 18 is provided for illustration. The mask 18 includes a substrate with a suitable material, such as a low thermal expansion material (LTEM) or fused quartz. In various examples, the LTEM includes TiO2 doped SiO2, or other suitable materials with low thermal expansion. In some embodiments, the LTEM includes 5%-20% by weight TiO2 and has a thermal coefficient of expansion lower than about $1.0 \times 10^{-6}/^\circ$ C. For example, in some embodiments, the TiO2 doped SiO2 material of the LTEM has a coefficient thermal expansion such that it varies by less than 60 parts-per-billion for every 1 degree Celsius of temperature change. Of course, other suitable materials having thermal coefficient of expansion that is equal to or less than TiO2 doped SiO2 may also be used.

The mask 18 also includes a reflective ML deposited on the substrate. The ML includes a plurality of film pairs, such as molybdenum-silicon (Mo/Si) film pairs (e.g., a layer of molybdenum above or below a layer of silicon in each film pair). Alternatively, the ML may include molybdenum-beryllium (Mo/Be) film pairs, or other suitable materials that are configurable to highly reflect the EUV light.

The mask 18 may further include a capping layer, such as ruthenium (Ru), disposed on the ML for protection. The mask 18 further includes an absorption layer deposited over the ML. The absorption layer is patterned to define a layer of an integrated circuit (IC). Alternatively, another reflective layer may be deposited over the ML and is patterned to define a layer of an integrated circuit, thereby forming a EUV phase shift mask.

The lithography system 10 also includes a projection optics module (or projection optics box (POB) 20 for imaging the pattern of the mask 18 on to a target 26 secured on a substrate stage 28 of the lithography system 10. The POB 20 has refractive optics (such as for UV lithography system) or alternatively reflective optics (such as for EUV lithography system) in various embodiments. The light directed from the mask 18, diffracted into various diffraction orders and carrying the image of the pattern defined on the mask, is collected by the POB 20. The POB 20 may include a magnification of less than one (thereby the size of the "image" on a target (such as target 26 discussed below) is smaller than the size of the corresponding "object" on the mask). The illuminator 14 and the POB 20 are collectively referred to as an optical module of the lithography system 10.

The lithography system 10 also includes a pupil phase modulator 22 to modulate optical phase of the light directed from the mask 18 so that the light has a phase distribution on a projection pupil plane 24. In the optical module, there is a plane with field distribution corresponding to Fourier Transform of the object (the mask 18 in the present case). This plane is referred to as projection pupil plane. The pupil phase modulator 22 provides a mechanism to modulate the optical phase of the light on the projection pupil plane 24. In some embodiments, the pupil phase modulator 22 includes a mechanism to tune the reflective mirrors of the POB 20 for phase modulation. For example, the mirrors of the POB 20 are switchable and are controlled to reflect the EUV light, thereby modulating the phase of the light through the POB 20.

In some embodiments, the pupil phase modulator 22 utilizes a pupil filter placed on the projection pupil plane. A pupil filter filters out specific spatial frequency components of the EUV light from the mask 18. Particularly, the pupil filter is a phase pupil filter that functions to modulate phase distribution of the light directed through the POB 20. However, utilizing a phase pupil filter is limited in some lithography system (such as an EUV lithography system) since all materials absorb EUV light.

As discussed above, the lithography system 10 also includes the substrate stage 28 to secure a target 26 to be patterned, such as a semiconductor substrate. In the present embodiment, the semiconductor substrate is a semiconductor wafer, such as a silicon wafer or other type of wafer. The target 26 is coated with the resist layer sensitive to the radiation beam, such as EUV light in the present embodiment. Various components including those described above are integrated together and are operable to perform lithography exposing processes. The lithography system 10 may further include other modules or be integrated with (or be coupled with) other modules.

The mask 18 and the method making the same are further described in accordance with some embodiments. In some embodiments, the mask fabrication process includes two operations: a blank mask fabrication process and a mask patterning process. During the blank mask fabrication process, a blank mask is formed by deposing suitable layers (e.g., reflective multiple layers) on a suitable substrate. The blank mask is then patterned during the mask patterning process to achieve a desired design of a layer of an integrated circuit (IC). The patterned mask is then used to transfer circuit patterns (e.g., the design of a layer of an IC) onto a semiconductor wafer. The patterns can be transferred over and over onto multiple wafers through various lithography processes. A set of masks is used to construct a complete IC.

The mask 18 includes a suitable structure, such as a binary intensity mask (BIM) and phase-shifting mask (PSM) in various embodiments. An example BIM includes absorptive regions (also referred to as opaque regions) and reflective regions, patterned to define an IC pattern to be transferred to the target. In the opaque regions, an absorber is present, and an incident light is almost fully absorbed by the absorber. In the reflective regions, the absorber is removed and the incident light is diffracted by a multilayer (ML). The PSM can be an attenuated PSM (AttPSM) or an alternating PSM (AltPSM). An exemplary PSM includes a first reflective layer (such as a reflective ML) and a second reflective layer patterned according to an IC pattern. In some examples, an AttPSM usually has a reflectivity of 2%-15% from its absorber, while an AltPSM usually has a reflectivity of larger than 50% from its absorber.

Figure 2:
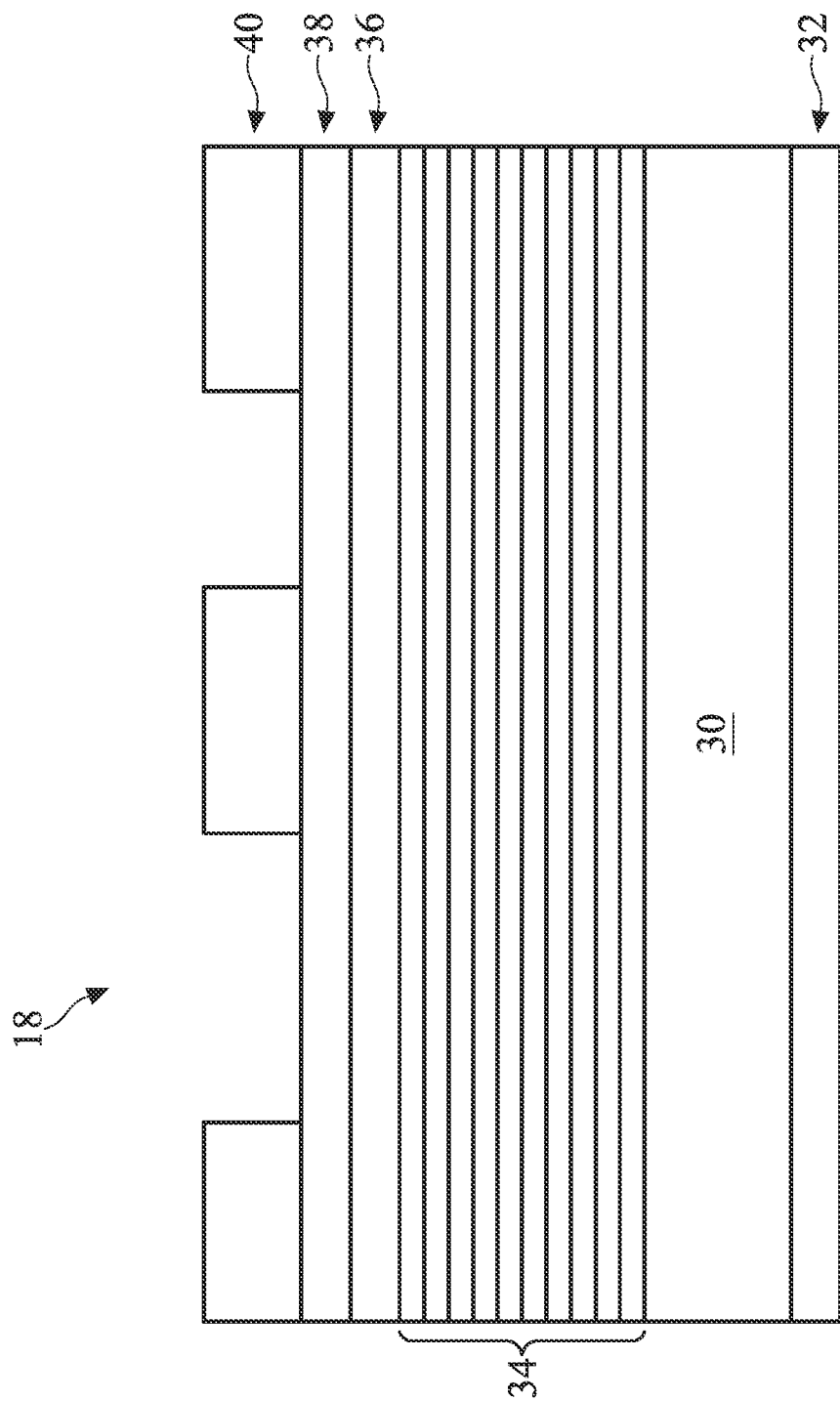
FIG. 2 is a sectional view of a EUV mask constructed in accordance with some embodiments of the present disclosure.

One example of the mask 18 is shown in FIG. 2. The mask 18 in the illustrated embodiment is a EUV mask, and includes a substrate 30 made of a LTEM. The LTEM material may include TiO2 doped SiO2, and/or other low thermal expansion materials known in the art. In some embodiments, a conductive layer 32 is additionally disposed under on the backside of the LTEM substrate 30 for the electrostatic chucking purpose. In one example, the conductive layer 32 includes chromium nitride (CrN). In other embodiments, other suitable compositions are possible, such as a tantalum-containing material.

The EUV mask 18 includes a reflective multilayer (ML) structure 34 disposed over the LTEM substrate 30. The ML structure 34 may be selected such that it provides a high reflectivity to a selected radiation type/wavelength. The ML structure 34 includes a plurality of film pairs, such as Mo/Si film pairs (e.g., a layer of molybdenum above or below a layer of silicon in each film pair). Alternatively, the ML structure 34 may include Mo/Be film pairs, or any materials with refractive index difference being highly reflective at EUV wavelengths.

Still referring to FIG. 2, the EUV mask 18 also includes a capping layer 36 disposed over the ML structure 34 to prevent oxidation of the ML. In one embodiment, the capping layer 36 includes silicon with a thickness ranging from about 4 nm to about 7 nm. The EUV mask 18 may further include a buffer layer 38 disposed above the capping layer 36 to serve as an etching-stop layer in a patterning or repairing process of an absorption layer, which will be described later. The buffer layer 38 has different etching characteristics from the absorption layer disposed thereabove. The buffer layer 38 includes ruthenium (Ru), Ru compounds such as RuB, RuSi, chromium (Cr), chromium oxide, and chromium nitride in various examples.

The EUV mask 18 also includes an absorber layer 40 (also referred to as an absorption layer) formed over the buffer layer 38. In some embodiments, the absorber layer 40 absorbs the EUV radiation directed onto the mask. In various embodiments, the absorber layer may be made of tantalum boron nitride (TaBN), tantalum boron oxide (TaBO), or chromium (Cr), Radium (Ra), or a suitable oxide or nitride (or alloy) of one or more of the following materials: Actinium, Radium, Tellurium, Zinc, Copper, and Aluminum.

The EUV lithography system discussed above in FIGS. 1-2 is merely an example lithography system for which overlay marks can be used. However, the overlay marks of the present disclosure may be used for other types of lithography systems too. The overlay marks of the present disclosure will now be discussed below in more detail.

Figure 3:
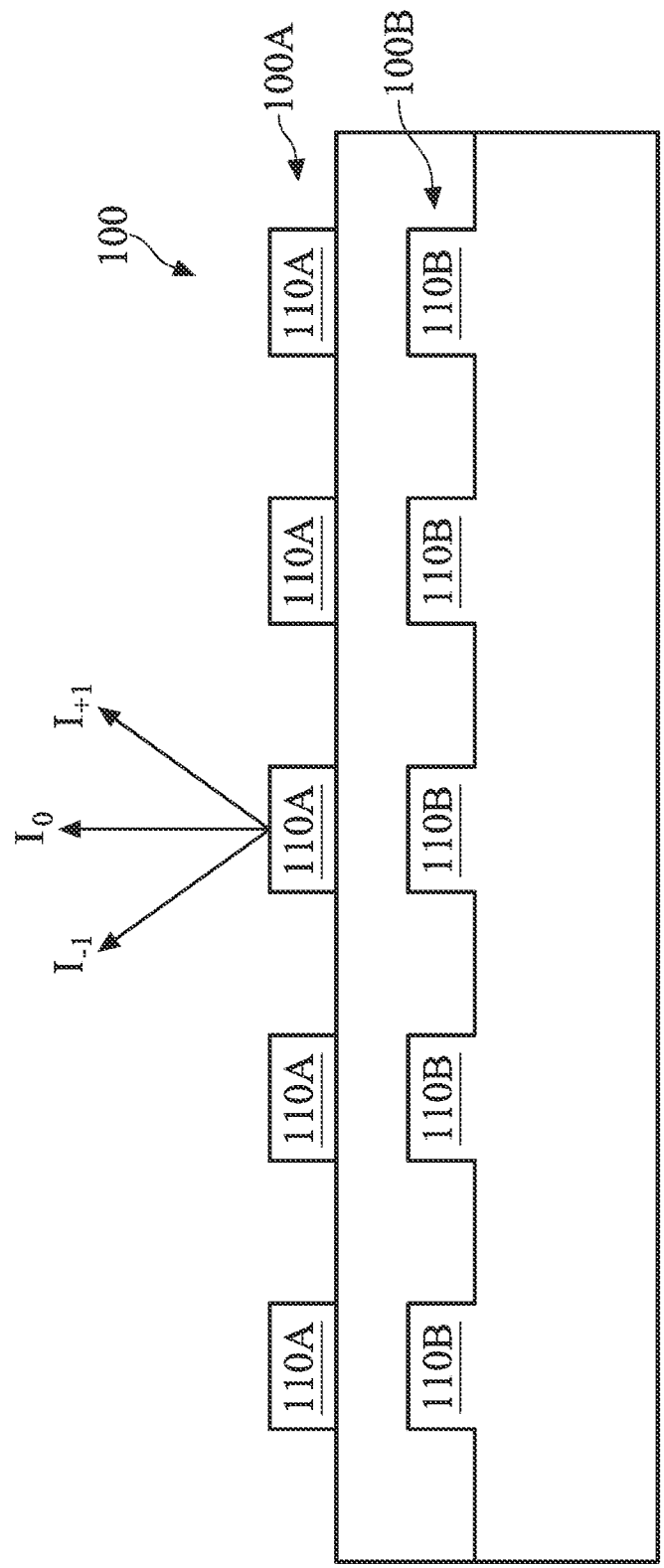
FIG. 3 illustrates a simplified fragmentary cross-sectional view of an overlay mark 100 in accordance with some embodiments of the present disclosure.

FIG. 3 illustrates a simplified fragmentary cross-sectional side view of an overlay mark 100. The overlay mark 100 includes an upper layer 100A and a lower layer 100B. In some embodiments, the upper layer 100A includes a patterned photoresist layer, and the lower layer 100B includes a patterned material layer on a wafer. In other embodiments, the upper layer 100A and the lower layer 100B may include different patterned layers on a wafer. It is understood that the upper layer 100A may be patterned using one photomask, and the lower layer 100B may be patterned using a different photomask.

The upper layer 100A and the lower layer 100B each include a plurality of patterned components, also referred to as gratings. For example, the upper layer 100A includes a plurality of gratings 110A, and the lower layer 100B includes a plurality of gratings 110B. The gratings 110A and 110B are elongated features that extend in a certain direction, for example in a direction orthogonal to the cross-section in which the cross-sectional view of FIG. 3 is taken. In some embodiments, the gratings 110A are periodically distributed, and/or the gratings 110B are periodically distributed. In other words, the gratings 110A are separated from one another by a constant spacing, and the gratings 110B are separated from one another by a constant spacing.

An overlay between the upper layer 100A and the lower layer 100B may be measured by light diffraction. For example, in response to incident light projected onto the overlay mark 100, different orders of diffracted light may be produced as a result. In FIG. 3, a 0th order diffracted light is shown as I0, a +1 order diffracted light is shown as $I_{+1}$, and a −1 order diffracted light is shown as $I_{-1}$. The intensities of the various diffracted orders of light may be measured by an optical measurement tool. In some embodiments, the optical measurement tool includes a scatterometry machine. In some other embodiments, the optical measurement tool includes a diffractometry machine. It is understood that the optical measurement tool may also be configured to generate the incident light in some embodiments. Based on the measured $I_{+1}$ and $I_{-1}$ data, asymmetry information (As) associated with the overlay mark 100 can be defined as $As=I_{+1}-I_{-1}$.

The asymmetry information is used to determine overlay. For example, if $I_{-1}$ is greater than $I_{+1}$, it may indicate a misalignment between the upper and lower layers 100A and 100B where the upper layer 100A is "shifted to the left" compared to the lower layer 100B. If $I_{+1}$ is greater than $I_{-1}$, it may indicate a misalignment between the upper and lower layers 100A and 100B where the upper layer 100A is "shifted to the right" compared to the lower layer 100B. If $I_{+1}$ is equal to $I_{-1}$, it may represent a substantial alignment between the upper layer 100A and lower layer 100B. If the determined overlay does not meet specifications, then the upper layer 100A may be removed (e.g., via a photoresist stripping or ashing process), and a new upper layer may be formed or defined using adjusted parameters (e.g. location of photomask). The new upper layer may still include a photoresist layer that is patterned by the photomask, for example. The new upper layer should have better overlay with the lower layer 100B as a result of the adjusted parameters.

Referring now to FIGS. 4A-4B, superimposed simplified fragmentary cross-sectional views of an upper layer 130A and a lower layer 130B are illustrated. The upper layer 130A and the lower layer 130B may be two different layers of an overlay mark on a photomask. The upper layer 130A and the lower layer 130B include a plurality of gratings 140A and 140B, respectively. A known bias may be introduced between the upper layer 130A and the lower layer 130B. For example, FIG. 4A shows a known bias −d between the upper layer 130A and lower layer 130B. In other words, the gratings 140A in the upper layer 130A may be "shifted to the left" with respect to the gratings 140B in the lower layer 130B. On the other hand, FIG. 4B shows a known bias +d between the upper layer 130A and lower layer 130B. In other words, the gratings 140A in the upper layer 130A may be "shifted to the right" with respect to the gratings 140B in the lower layer 130B. The known biases +d or −d may be intentionally configured or implemented as a part of the design of the photomask.

As a wafer is fabricated, the actual total shift between an upper layer and a lower layer includes the known bias (+d or −d), as well as an overlay (denoted herein as OV or OVL). The overlay refers to the misalignment between the upper and lower layers during wafer fabrication, which is undesirable and should be minimized. Asymmetry is a function of the shift, and as such it is a function of the overlay, for example as expressed below: As=K*(OV+d), where As represents asymmetry, K represents a slope of a linear function (function of asymmetry and shift), OV represents overlay, and d represents the known bias. In this equation, As can be measured (e.g., by measuring the diffraction of light discussed above with reference to FIG. 3), and d is known. Thus, K and OV are two variables that can be calculated with two equations. For example, in the two equations below, $As^{+d}$ and $As^{-d}$ are two different asymmetry calculations, one made with an overlay mark where the upper and lower layers have a +d bias, and the other one made with an overlay mark where the upper and lower layers have a −d bias. Once the asymmetry information $As^{+d}$ and $As^{-d}$ is calculated, the overlay OV and K can be calculated as well.

$$\left. \begin{array}{l} As^{+d} = K^*(OV+d) \\ As^{-d} = K^*(OV-d) \end{array} \right\} \Longrightarrow OV =$$

$$d \times \left( \frac{As^{+d} + As^{-d}}{As^{+d} - As^{-d}} \right) k = \frac{As^{+d} - As^{-d}}{2d}$$

Figure 5:
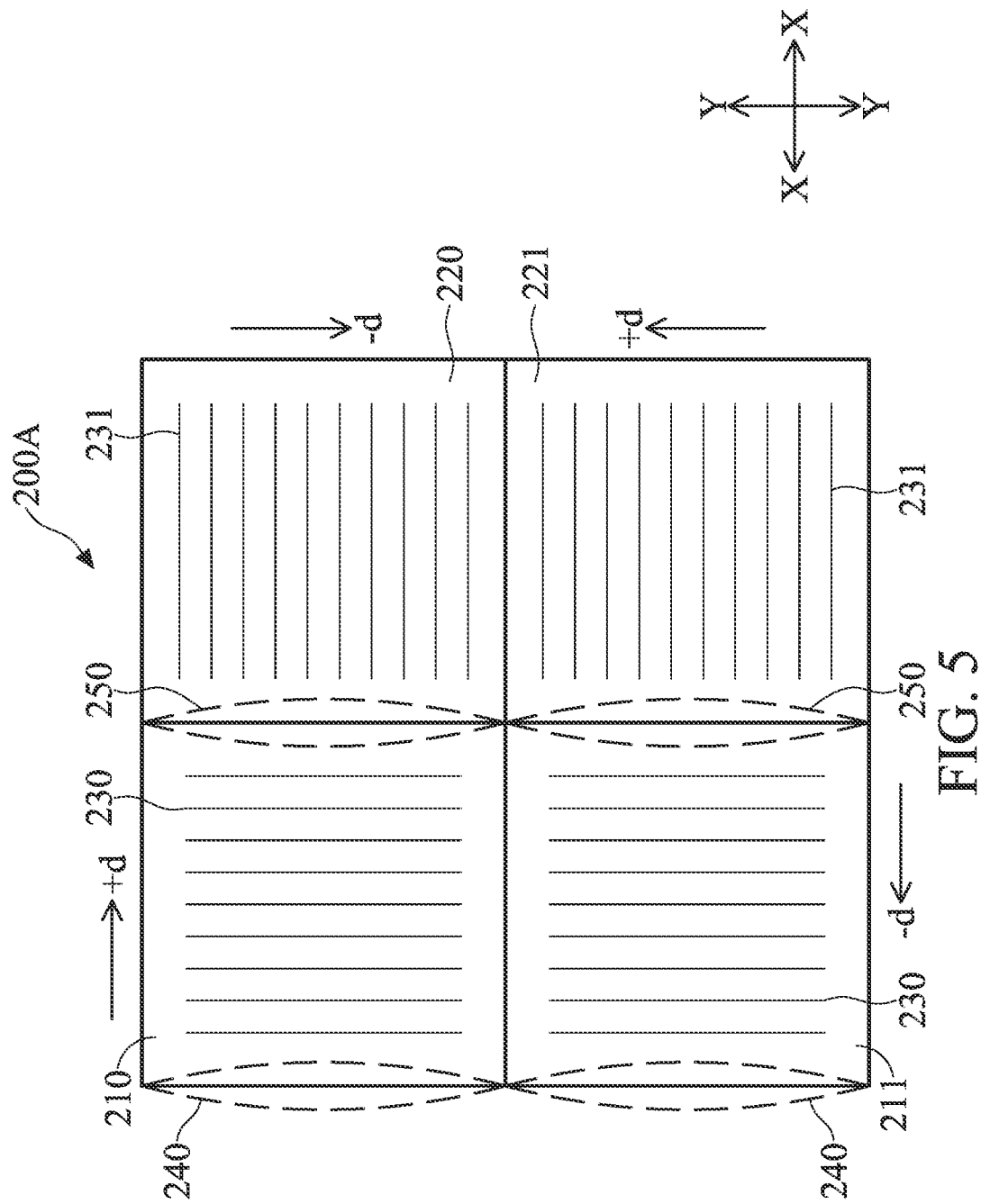
FIG. 5 illustrates a top view of an embodiment of an overlay mark on a wafer in accordance with some embodiments of the present disclosure.

Referring now to FIG. 5, a top view of an embodiment of an overlay mark 200A on a wafer is illustrated. The overlay mark 200A may include a plurality of components or portions, for example four different components 210-211 and 220-221 as shown in FIG. 5. The components 210-211 are aligned with each other, for example in the Y-direction, and the components 220-221 are aligned with each other, for example in the Y-direction.

The components 210-211 each include a plurality of gratings (e.g., such as gratings 230) that extend in a Y-direction, and the components 220-221 each include a plurality of gratings (e.g., such as gratings 231) that extend in an X-direction that is perpendicular to the Y-direction. Each of the components 210-211 and 220-221 also includes an upper layer and a lower layer, similar to the upper and lower layers 100A and 100B shown in FIG. 3. In each of the components 210-211 and 220-221 of the overlay mark 200A, the gratings are located in both the upper layer and the lower layer.

A known bias is introduced in each of the components 210-211 and 220-221. For the component 210, a known bias +d is introduced in the X-direction—that is, the gratings in its upper layer are offset from the gratings in its lower layer by +d in the X-direction. For the component 211, a known bias −d is introduced in the X-direction—that is, the gratings in its upper layer are offset from the gratings in its lower layer by −d in the X-direction. For the component 220, a known bias −d is introduced in the Y-direction—that is, the gratings in its upper layer are offset from the gratings in its lower layer by −d in the Y-direction. For the component 221, a known bias +d is introduced in the Y-direction—that is, the gratings in its upper layer are offset from the gratings in its lower layer by +d in the Y-direction. The components 210-211 may be used to obtain two asymmetry measurements (e.g., $As^{+d}$ and $As^{-d}$) in the X-direction, so as to be able to determine the overlay in the X-direction. The components 220-221 may be used to obtain two asymmetry measurements (e.g., $As^{-d}$ and $As^{+d}$) in the Y-direction, so as to be able to determine the overlay in the Y-direction.

Figure 6A:
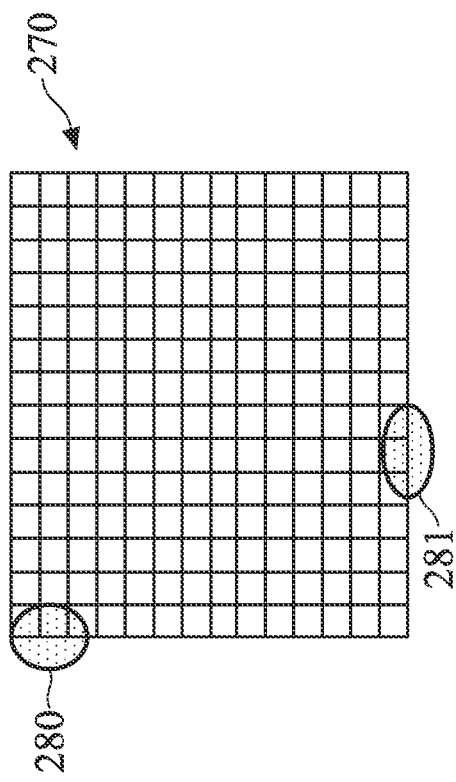
FIG. 6A is a simplified top view of a portion of a wafer in accordance with some embodiments of the present disclosure.
Figure 6C:
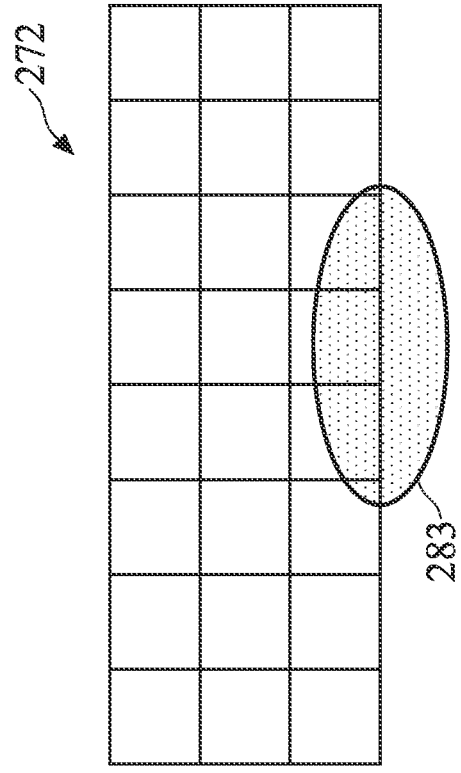
FIG. 6C is a simplified top view of a test line that is horizontally oriented in accordance with some embodiments of the present disclosure.
Figure 6B:
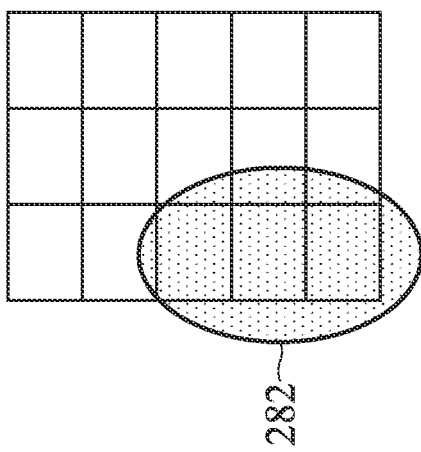
FIG. 6B is a simplified top view of a test line that is vertically oriented in accordance with some embodiments of the present disclosure.

According to the various aspects of the present disclosure, regions 240 of the overlay mark 200A are located in a region with a lower pattern density than regions 250 of the overlay mark 200A. In some embodiments, the lower pattern density region may include an edge of an IC, or an edge of a test line. For example, referring now to FIGS. 6A, 6B, and 6C, which illustrate some example situations where different pattern densities may exist. In more detail, FIG. 6A is a simplified top view of a portion of a wafer 270 (e.g., an IC chip on the wafer), FIG. 6B is a simplified top view of a test line 271 that is vertically oriented (oriented in the Y-direction), and FIG. 6C is a simplified top view of a test line 272 that is horizontally oriented (oriented in the X-direction). For the portion of the wafer 270 in FIG. 6A, its edge regions (such as edge regions 280-281) may have a lower pattern density than the rest of the portion of the wafer 270. Similarly, for the test lines 271-272, their edge regions (such as edge regions 282 and 283) may have a lower pattern density than the rest of the test lines too.

The differences in pattern density may lead to different profiles for patterned features, such as the gratings in an overlay mark. An example of the different grating profiles as a result of the pattern density difference is shown in FIGS. 7A-7B. In more detail, FIG. 7A illustrates a cross-sectional profile of a plurality of gratings 300-303 of an overlay mark, and FIG. 7B illustrates a cross-sectional profile of a plurality of gratings 310-313 of an overlay mark. The gratings 300-303 and 310-313 may be embodiments of the gratings 230 or 231 discussed above with reference to FIG. 5. The gratings 300-303 and 310-313 are illustrated as "trenches" herein, but it is understood that they may be "islands" in other embodiments.

In FIG. 7A, the regions of the wafer (or test line) in which the gratings 300-303 are located may have relatively similar pattern densities. As such, the gratings 300-303 all have similar cross-sectional side view profiles, for example with respect to their shapes, widths, or heights. In comparison, in FIG. 7B, the regions of the wafer (or test line) in which the gratings 310-313 are located may have different pattern densities. For example, the region of the wafer (or test line) in which the grating 310 is located may have a lower pattern density than the regions of the wafer (or test line) in which the gratings 311-313 are located. This may occur when the grating 310 is located close to an edge of the wafer or test line, such as in the regions 280-283 in FIGS. 6A-6C. As a result, the cross-sectional side view profile of the grating 310 is different than the cross-sectional side view profile of the gratings 311-313. Some of these differences may involve differences in shape (e.g., more or less trapezoidal), or width and/or height of the gratings. The differences in the gratings 310-313 (due to pattern density differences) may lead to unwanted noise, which could adversely impact the overlay measurement accuracies.

Referring back to FIG. 5, in order to suppress or minimize the effects of this noise (caused by differences in pattern density) discussed above, the present disclosure specifically arranges the components 210-211 and 220-221 of the overlay mark 200A in a novel configuration. For example, since the regions 240 have lower pattern densities than the regions 250, the overlay mark 200A is arranged such that the components 210-211 each have a border (e.g., the left border) that is located in the regions 240, where these borders are aligned with each other. Stated differently, the components 210-211 are respectively arranged in the "top left" and "bottom left" corners of the overlay mark 200A in FIG. 5, and the components 220-221 are respectively arranged in the "top right" and "bottom right" corners of the overlay mark 200A in FIG. 5. Note that the components 210-211 each have gratings that are oriented to extend in the Y-direction, with known biases +d and −d in the X-direction, respectively, whereas the components 220-221 each have gratings that are oriented to extend in the X-direction, with known biases +d and −d in the Y-direction.

The configuration of the components 210-211 and 220-221 shown in FIG. 5 minimizes the noise discussed above. Since the components 210-211 each have gratings (e.g., the leftmost gratings) in the region 240 that has the lower pattern density, the components 210-211 will each have gratings in similar positions therein that have distorted cross-sectional profiles (compared to the gratings in the rest of the components 210-211). As such, the components 210-211 will still have similar cross-sectional profiles as each other, since they each have one or more gratings that are distorted as a result of being located in a low-pattern-density region. As discussed above, the overlay in the X-direction may be calculated using the components 210-211 of the overlay mark 200A. In that case, the noise created as a result of the distorted gratings in the low-pattern-density regions 240 may be canceled, since the components 210 and 211 each have the distorted gratings in the same or similar locations therein. Thus, the overlay mark 200A can achieve better overlay measurement accuracy than conventional overlay marks.

Figure 9:
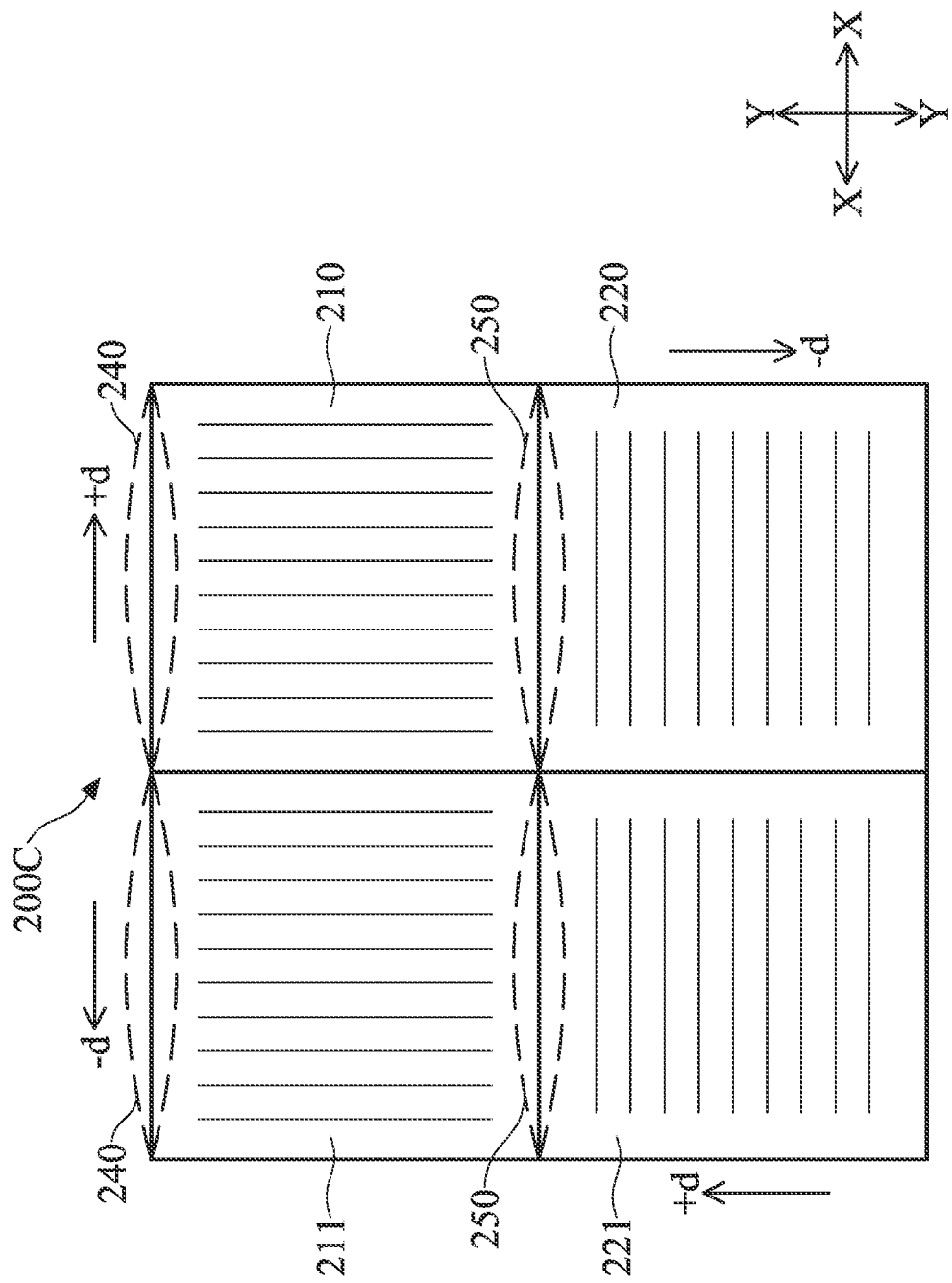
Figure 10:
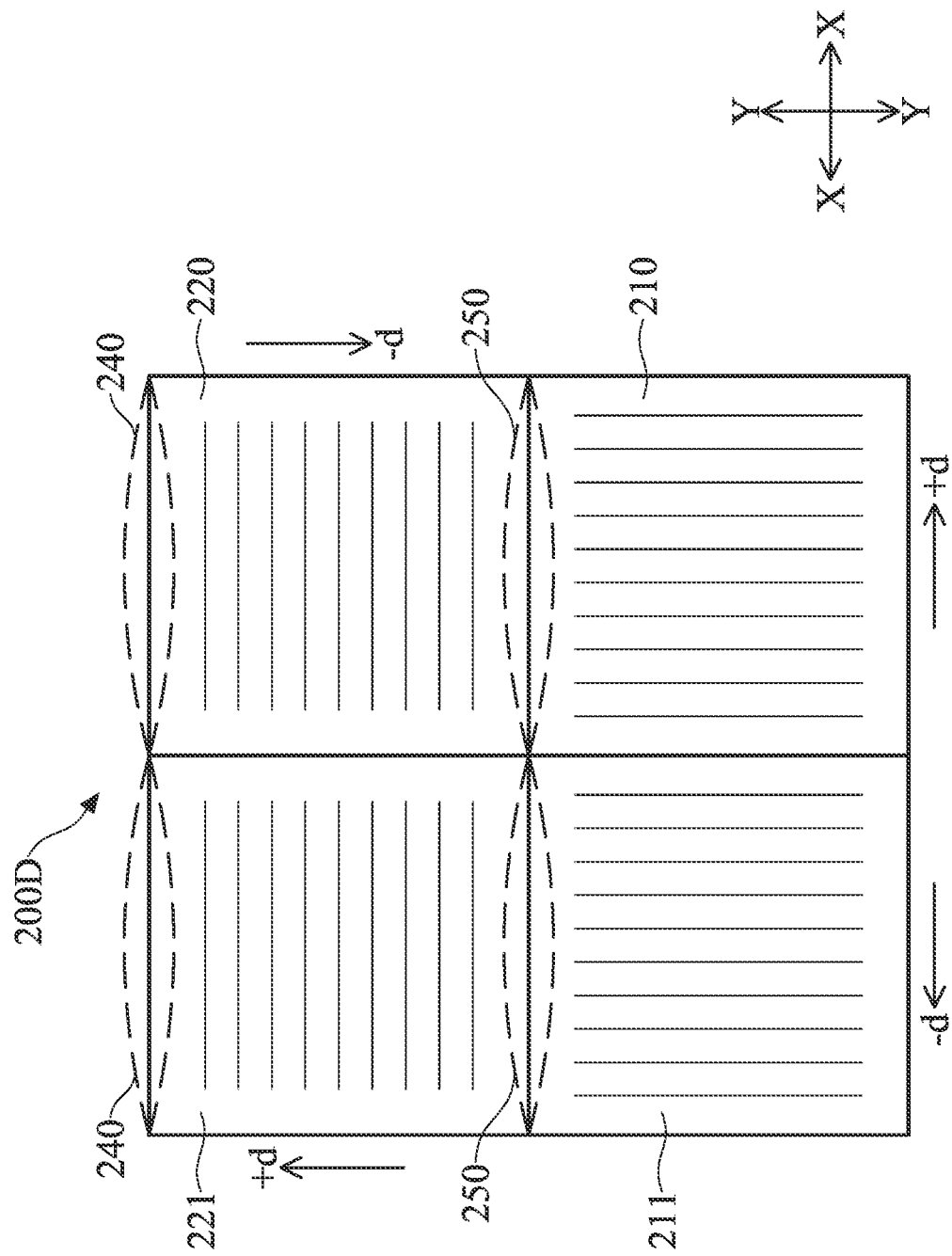

FIGS. 8-10 illustrate top views of other embodiments of overlay marks, which are illustrated as overlay marks 200B, 200C, and 200D on a wafer, respectively. These embodiments of the overlay marks 200B, 200C, and 200D are similar in some aspects to the embodiment of the overlay mark 200A shown in FIG. 5. Thus, for reasons of consistency and clarity, similar elements will be labeled the same in FIGS. 5 and 8-10. For example, the overlay marks 200A, 200B, 200C, and 200D each include components 210-211 with gratings that extend in the Y-direction, but with +d and −d biases in the X-direction, respectively. The overlay marks 200A, 200B, 200C, and 200D also each include components 220-221 with gratings that extend in the X-direction, but with +d and −d biases in the Y-direction, respectively. Furthermore, reference numerals 240 are also used to designate regions with a low pattern density (e.g., compared to the regions 250), and reference numerals 250 are also used to designate regions with a high pattern density (e.g., compared with the regions 240).

In the embodiment shown in FIG. 8, the component 221 is implemented in the "top left" corner of the overlay mark 200B, the component 220 is implemented in the "bottom left" corner of the overlay mark 200B, the component 211 is implemented in the "top right" corner of the overlay mark 200B, and the component 210 is implemented in the "bottom right" corner of the overlay mark 200B. As such, the components 210-211 are aligned in the Y-direction, and the components 220-221 are aligned in the Y-direction.

Though the locations of the components 210-211 and 220-221 are different compared to the overlay mark 200A, both the overlay marks 200A and 200B implement two components adjacent to each other in the Y-direction (such as components 210-211 being adjacent to each other, or components 220-221 being adjacent to each other), where the adjacently-located components each have gratings that extend in the same direction, be it the X-direction (e.g., components 220-221) or the Y-direction (e.g., components 210-211).

In the embodiment shown in FIG. 9, the component 211 is implemented in the "top left" corner of the overlay mark 200C, the component 221 is implemented in the "bottom left" corner of the overlay mark 200C, the component 210 is implemented in the "top right" corner of the overlay mark 200C, and the component 220 is implemented in the "bottom right" corner of the overlay mark 200C. As such, the components 210-211 are aligned in the X-direction, and the components 220-221 are aligned in the X-direction.

Also different from the overlay marks 200A and 200B are the locations of the low pattern density regions 240 and the high pattern density regions 250 of the overlay mark 200C. As shown in FIG. 9, the topmost (in the Y-direction) borders of the components 210-211 are located in the low pattern density regions 240, and the bottommost (in the Y-direction) borers of the components 210-211—which are shared borders with the components 221-220, respectively—are located in the pattern density region 250, which do not have low pattern density. For example, the regions 240 may be at or near an edge of an IC chip, or at or near an edge of a test line. Because of the specific configuration shown in FIG. 9, the noise introduced by the low pattern density regions 240 impact the components 210-211 similarly, and thus the noise may be canceled out when the overlay calculations are done.

In the embodiment shown in FIG. 10, the component 221 is implemented in the "top left" corner of the overlay mark 200D, the component 211 is implemented in the "bottom left" corner of the overlay mark 200D, the component 220 is implemented in the "top right" corner of the overlay mark 200D, and the component 210 is implemented in the "bottom right" corner of the overlay mark 200D. As such, the components 210-211 are aligned in the X-direction, and the components 220-221 are aligned in the X-direction.

The locations of the regions 240-250 are similar as in FIG. 9. Note that both the overlay marks 200C and 200D implement two components adjacent to each other in the X-direction (such as components 210-211 being adjacent to each other, or components 220-221 being adjacent to each other), where the adjacently-located components each have gratings that extend in the same direction, be it the X-direction (e.g., components 220-221) or the Y-direction (e.g., components 210-211).

It is understood that additional embodiments of the overlay mark are also possible. For example, in an alternative embodiment, the overlay mark may be arranged similarly as the overlay mark of 200A, but with the positions of the components 220 and 221 swapped. As another example, in an alternative embodiment, the overlay mark may be arranged similarly as the overlay mark of 200A, but with the positions of the components 210 and 211 swapped. Regardless of the particular embodiment, the overlay mark of the present disclosure can achieve better overlay measurement performance, as the arrangement discussed above allows the noise caused by the pattern density differences to be canceled or substantially reduced.

Figure 11:
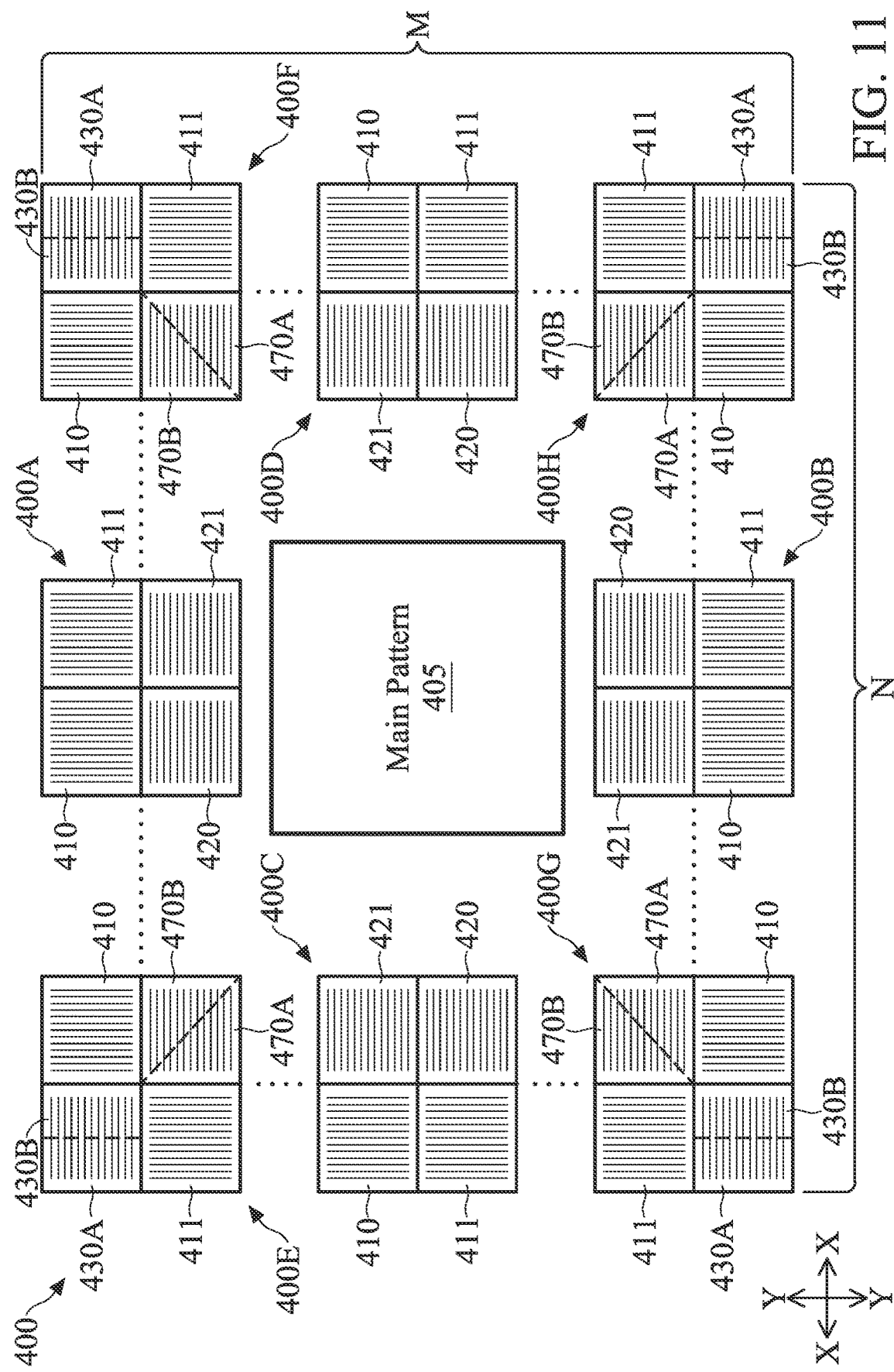
FIG. 11 illustrates a plurality of overlay marks that are arranged as an M×N array around a main pattern in accordance with some embodiments of the present disclosure.

Referring now to FIG. 11, a plurality of overlay marks 400 can be arranged as an M×N array around a main pattern 405 on a wafer according to various aspects of the present disclosure. M represents the number of rows in the array, and N represents the number of columns in the array. In some embodiments, a main pattern 405 may be a portion of an IC, which includes patterns corresponding to active regions, source/drains, interconnect elements, etc. The main pattern 405 may include regions with poor pattern density uniformity, for example, regions with much greater pattern densities than other regions. The main pattern 405 may also include regions of bad CD uniformity, for example, regions with greater CD differences.

The M×N array of overlay marks 400 may include a plurality of overlay marks, such as the eight overlay marks 400A-400H illustrated in FIG. 11. At least some of these overlay marks 400A-400H may include multiple components that are similar to the components 210-211 and/or 220-221 discussed above. For example, the overlay marks 400A, 400B, 400C, and 400D are disposed on 4 different sides (e.g., top, bottom, left, and right) of the main pattern 405. The overlay marks 400A-400D each include a component 410 similar to the component 210 discussed above, a component 411 similar to the component 211 discussed above, a component 420 similar to the component 220 discussed above, and a component 421 similar to the component 221 discussed above. For example, each of these components 410-411 and 420-421 may include an upper layer and a lower layer, where a bias of +d or a bias of −d exists between the upper and lower layers. Again, in some embodiments, the upper layer may include a patterned photoresist layer while the lower layer may include a patterned material layer on a substrate. In other embodiments, the upper layer and the lower layer may include different patterned layers on a substrate. Similar to the components 210-211 and 220-221, the components 410-411 are configured to measure the X-direction overlay, and the components 420-421 are configured to measure the Y-direction overlay.

For reasons similar to those discussed above with reference to FIGS. 5 and 8-10, the components in the overlay marks 400A-400B (which each face the X-direction borders of the main pattern 405) are configured such that the two components 420-421 (for measuring Y-directional overlay) are arranged adjacent to one another in the X-direction, and the two components 410-411 (for measuring X-directional overlay) are arranged adjacent to one another in the X-direction. As discussed above, this type of arrangement ensures that whatever noise that may come in at the horizontal edges of the overlay marks 400A-400B (the edges that face the "top" and "bottom" borders of the main pattern 405) will be reduced or canceled, when overlay is being measured using asymmetry information regarding diffracted light intensity.

Also for reasons similar to those discussed above with reference to FIGS. 5 and 8-10, the components in the overlay marks 400C-400D (which each face the Y-direction borders of the main pattern 405) are configured such that the two components 420-421 (for measuring Y-directional overlay) are arranged adjacent to one another in the Y-direction, and the two components 410-411 (for measuring X-directional overlay) are arranged adjacent to one another in the Y-direction. Again, this type of arrangement ensures that whatever noise that may come in at the vertical edges of the overlay marks 400C-400D (the edges that face the "left" and "right" borders of the main pattern 405) will be reduced or canceled, when overlay is being measured using asymmetry information regarding diffracted light intensity.

Whereas the overlay marks 400A-400D are each disposed adjacent to a respective border of the main pattern 405, the overlay marks 400E-400H are each disposed diagonally adjacent to a respective corner of the main pattern 405. For example, the overlay mark 400E is disposed diagonally adjacent to the "top left" corner of the main pattern 405, the overlay mark 400F is disposed diagonally adjacent to the "top right" corner of the main pattern 405, the overlay mark 400G is disposed diagonally adjacent to the "bottom left" corner of the main pattern 405, and the overlay mark 400H is disposed diagonally adjacent to the "bottom right" corner of the main pattern 405.

Due to the diagonal locations of the overlay marks 400E-400H, their components are configured differently. For example, the overlay marks 400E-400H also include components 410-411 that are similar to the components 210-211 discussed above. However, the components 410-411 are diagonally disposed with respect to each other, rather than being disposed immediately adjacent to one another in the X-direction or in the Y-direction. In addition, the overlay marks 400E-400H each include components 430A-430B, as well as components 470A-470B.

The components 430A-430B are configured to measure overlay in the Y-direction, and as such they each include gratings that extend in the X-direction. In this manner, the components 430A-430B collectively serve a function that is similar to the component 420 (or component 421). In other words, the components 430A-430B are similar to the component 420 being divided into two portions, where the divided left portion resembles the component 430A, and the divided right portion resembles the component 430B. However, unlike the component 420—where a constant bias d (be it plus or minus) exists in the Y-direction between its upper and lower layers—the gratings in the components 430A and 430B have different biases. In some embodiments, the upper layer may include a patterned photoresist layer while the lower layer may include a patterned material layer on a substrate. In other embodiments, the upper layer and the lower layer may include different patterned layers on a substrate.

Figure 12:
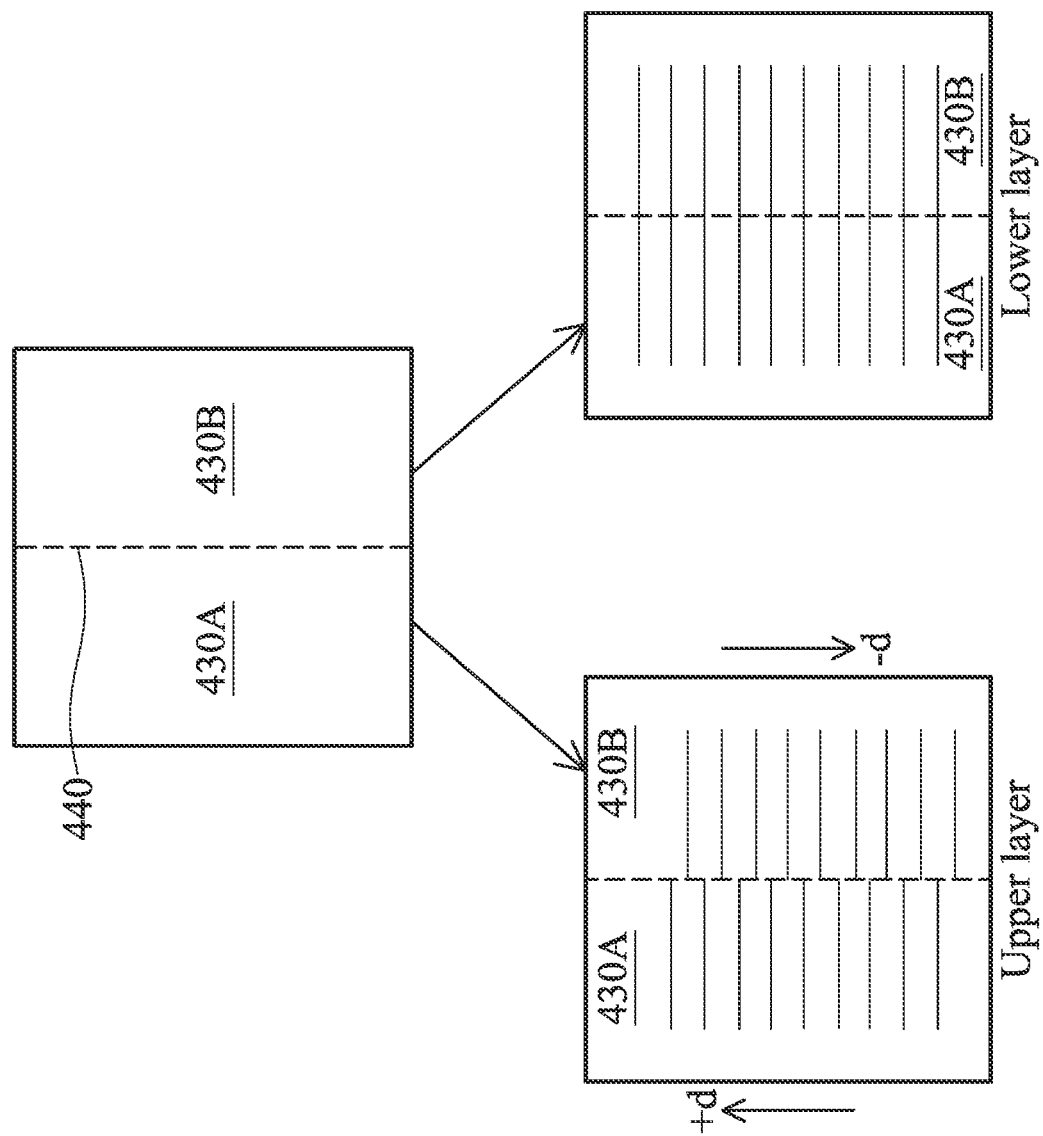
FIG. 12 illustrates top views of an upper layer and a lower layer of a component of an overlay mark in accordance with some embodiments of the present disclosure.

For example, referring to FIG. 12, top views of the upper layer and the lower layer of the components 430A-430B are illustrated separately according to embodiments of the present disclosure. The components 430A and 430B share a border 440 that extends in the Y-direction. This border 440 may be conceptual and not visible in the actual overlay mark. In other words, the border 440 merely denotes what would have been the demarcation line between the components 430A and 430B.

In the illustrated embodiment, the horizontally-oriented gratings in the component 430A are biased with +d, meaning that the gratings between the upper layer and the lower layer of the component 430A are shifted in the Y-direction by a distance +d. Meanwhile, the horizontally-oriented gratings in the component 430B are biased with −d, meaning that the gratings between the upper layer and the lower layer of the component 430B are shifted in the Y-direction by a distance −d. In the illustrated embodiment, the different biases between the components 430A and 430B are reflected as a shifting of the gratings in the upper layer, but the gratings in the lower layer of the components 430A and 430B remain un-shifted. However, this is merely an example. In other embodiments, the gratings in the upper layer may be un-shifted, while the gratings in the lower layer are shifted by +d and −d for the components 430A and 430B, respectively.

Referring back to FIG. 11, the components 470A-470B are also configured to measure overlay in the Y-direction, and as such they each include gratings that extend in the X-direction. In this manner, the components 470A-470B collectively serve a function that is similar to the component 420 (or the component 421). In other words, the components 470A-470B are similar to the component 420 being diagonally divided into two portions, where one diagonal portion (shaped as a right triangle) resembles the component 470A, and the opposite diagonal portion (shaped as another right triangle) resembles the component 470B. However, unlike the component 420—where a constant bias d (be it plus or minus) exists in the Y-direction between its upper and lower layers—the gratings in the components 470A and 470B have different biases.

Figure 13:
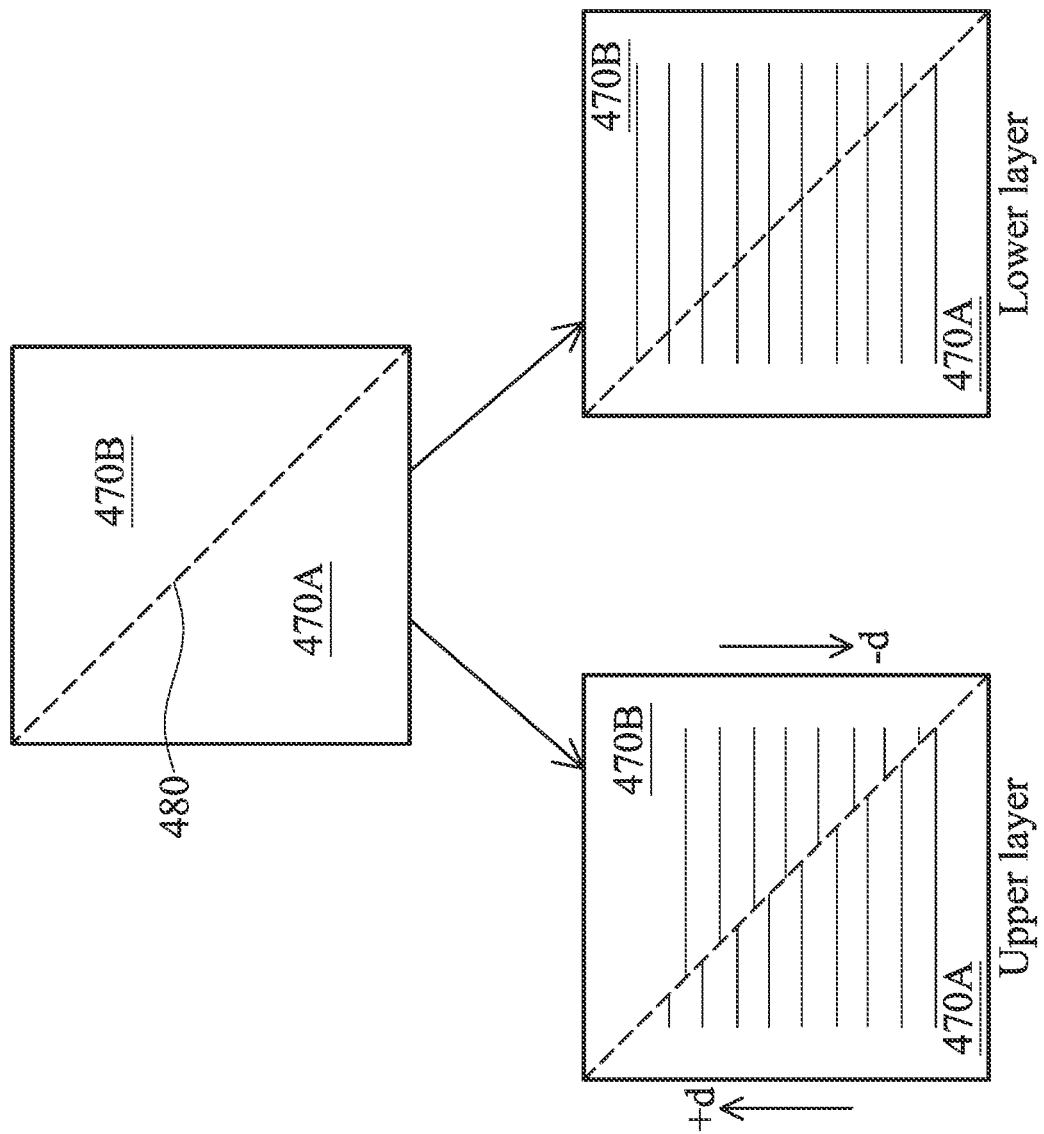
FIG. 13 illustrates top views of an upper layer and a lower layer of a component of an overlay mark in accordance with some embodiments of the present disclosure.

For example, referring to FIG. 13, top views of the upper layer and the lower layer of the components 470A-470B are illustrated separately according to embodiments of the present disclosure. The components 470A and 470B share a border 480 that extends diagonally in both the X-direction and the Y-direction. This border 480 may be conceptual and not visible in the actual overlay mark. In other words, the border 480 merely denotes what would have been the demarcation line between the components 470A and 470B.

Note that since the components 470A-470B are shaped similar to triangles, the gratings located in each of the components 470A-470B have uneven lengths in the X-direction. In the illustrated embodiment, the horizontally-oriented gratings in the component 470A are biased with +d, meaning that the gratings between the upper layer and the lower layer of the component 470A are shifted in the Y-direction by a distance +d. Meanwhile, the horizontally-oriented gratings in the component 470B are biased with −d, meaning that the gratings between the upper layer and the lower layer of the component 470B are shifted in the Y-direction by a distance −d. In the illustrated embodiment, the different biases between the components 470A and 470B are reflected as a shifting of the gratings in the upper layer, but the gratings in the lower layer of the components 470A and 470B remain un-shifted. However, this is merely an example. In other embodiments, the gratings in the upper layer may be un-shifted, while the gratings in the lower layer are shifted by +d and −d for the components 470A and 470B, respectively. It is also understood that although the components 470A and 470B are implemented in each of the overlay marks 400E, 400F, 400G, and 400H, they may be rotated in different directions in different overlay marks.

For reasons similar to those discussed above, the configuration of the components 430A-430B and 470A-470B also suppresses noise caused by the main pattern 405's pattern density issues. For example, the configuration of the components 430A-430B and 470A-470B allows the gratings for measuring the same direction's overlay to be located at similar distances to the main pattern 405. Thus, even if the main pattern 405's pattern density (or CD uniformity) issues cause noise that may come in at the borders of the overlay marks 400E-400H, the noise will be substantially reduced.

In the embodiment shown in FIGS. 11-13. The divided components (e.g., components 430A-430B and 470A-470B) in the overlay marks have gratings that extend in the X-direction, so that they are configured to measure the Y-directional overlay. However, this is merely an example. It is also understood that in some other embodiments, the divided components may have gratings that extend in the Y-direction, so that they are configured to measure the X-directional overlay. It is also understood that the configuration of the M×N array of overlay marks 400 herein is not limited to the eight overlay marks 400A-400H discussed above. In other embodiments, additional overlay marks similar to those discussed above may be implemented in each row and/or each column of the array.

Figure 14:
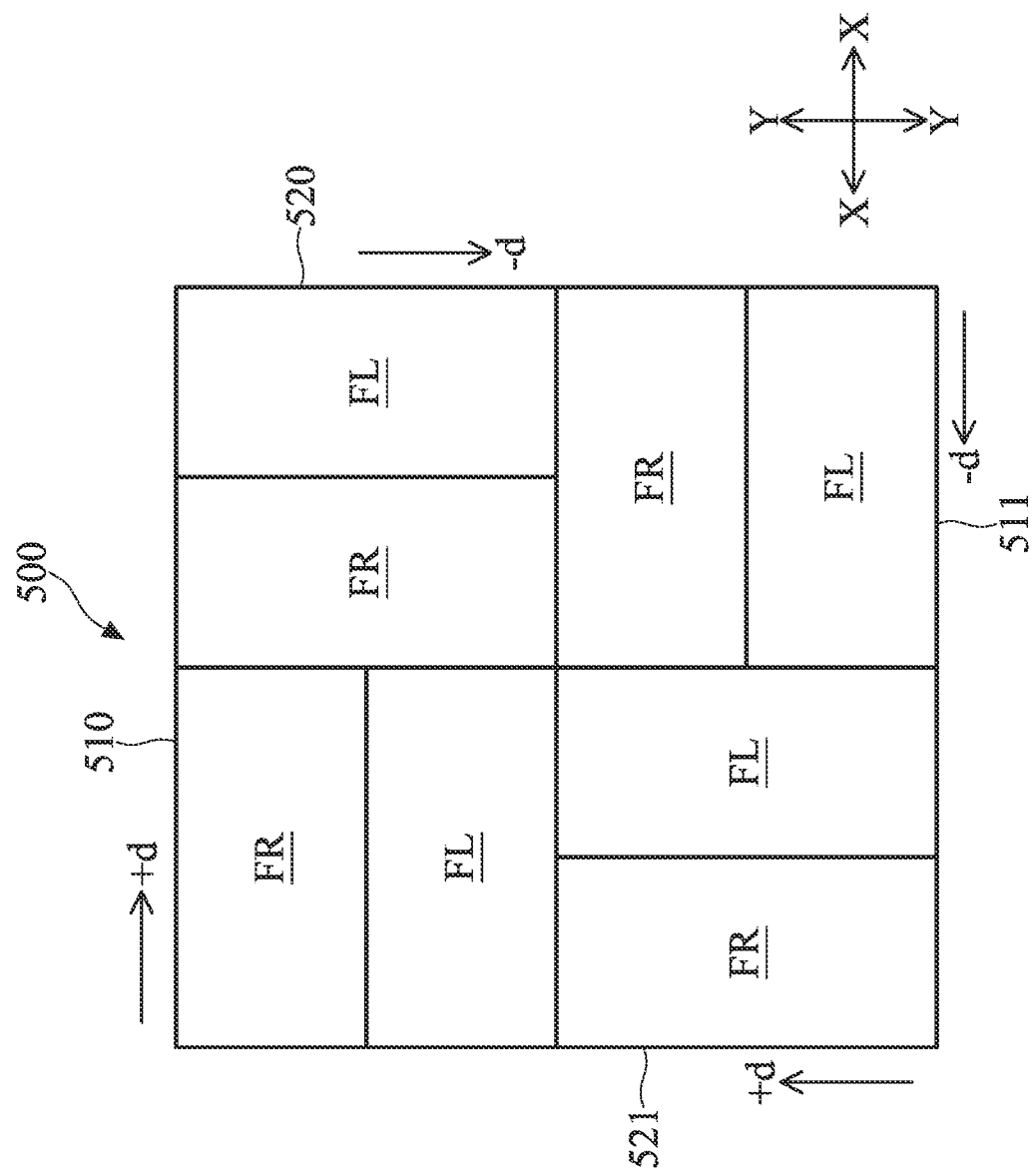
FIG. 14 illustrates a top view of an overlay mark in accordance with some embodiments of the present disclosure.

FIG. 14 illustrates a top view of an overlay mark 500 according to another embodiment of the present disclosure. The overlay mark 500 can be used to not only measure overlay, but also focus information, for example a focus that leads to an optimal critical dimension (CD) for semiconductor features on a wafer, as discussed in more detail below.

As is shown in FIG. 14, the overlay mark 500 may include components 510-511 that are used to measure an X-directional overlay, similar to the components 210-211 discussed above. The overlay mark 500 may also include components 520-521 that are used to measure a Y-directional overlay, similar to the components 220-221 discussed above. The component 510 is arranged at the "top left" corner of the overlay mark 500, the component 511 is arranged at the "bottom right" corner of the overlay mark 500, the component 520 is arranged at the "top right" corner of the overlay mark 500, and the component 521 is arranged at the "bottom left" corner of the overlay mark 500. As such, the component 510 is located directly adjacent to the components 520-521 (and the same is true for the component 511), and the components 510 and 511 are also located diagonally adjacent to one another. However, it is understood that the arrangement of the components 510-511 and 520-521 shown in FIG. 14 is merely an example, and that they may be arranged differently in other embodiments, for example similar to the embodiments shown in FIGS. 5 and 8-10.

It is also understood that the components 510-511 and 520-521 may each have a built-in bias with respect to its upper layer and lower layer, similar to the overlay marks discussed above with reference to FIGS. 5 and 8-10. For example, the component 510 may have a +d bias between its upper and lower layers in the X-direction, the component 511 may have a −d bias between its upper and lower layers in the X-direction, the component 520 may have a −d bias between its upper and lower layers in the Y-direction, and the component 521 may have a +d bias between its upper and lower layers in the Y-direction. Again, in some embodiments, the upper layer may include a patterned photoresist layer while the lower layer may include a patterned material layer on a substrate. In other embodiments, the upper layer and the lower layer may include different patterned layers on a substrate.

Figure 15B:
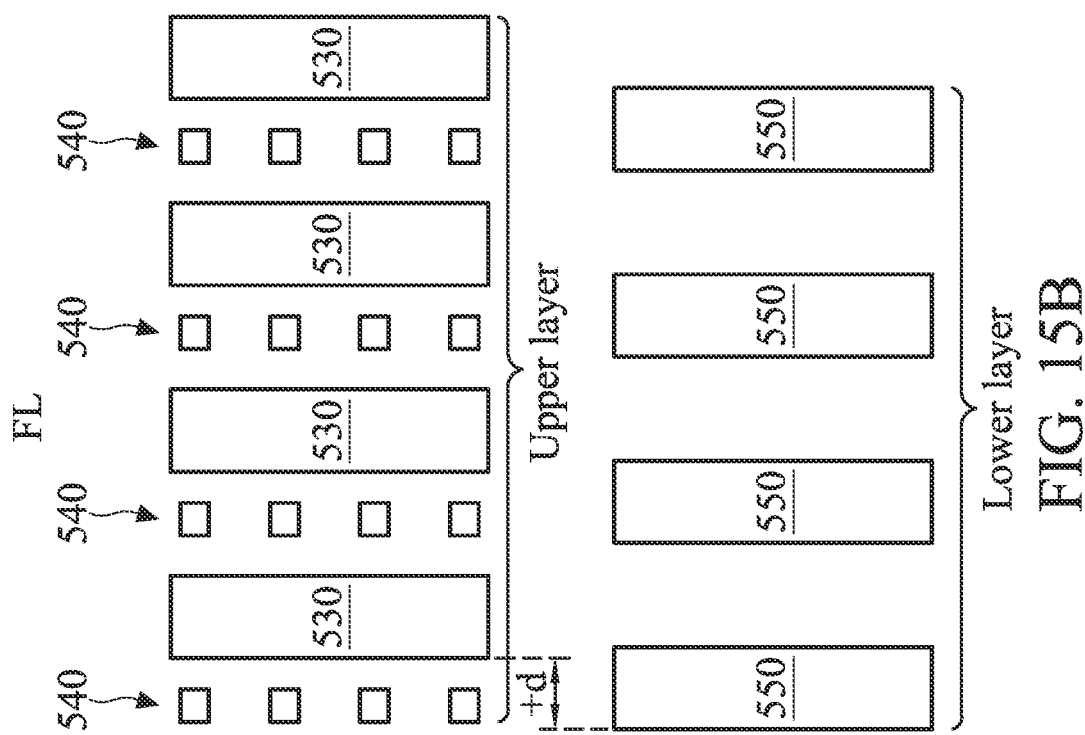
FIG. 15B illustrates the fragmentary top views of an upper layer and a lower layer of an FL region of an overlay mark in accordance with some embodiments of the present disclosure.
Figure 15A:
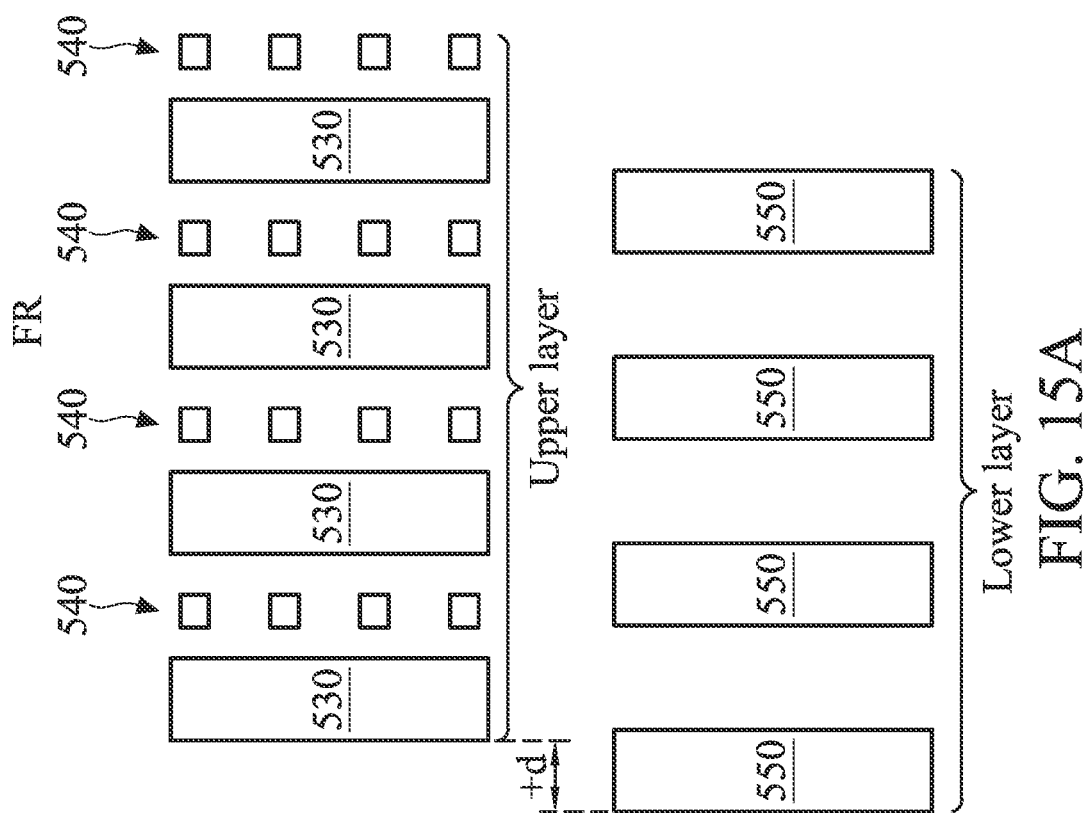
FIG. 15A illustrates the fragmentary top views of an upper layer and a lower layer of an FR region of an overlay mark in accordance with some embodiments of the present disclosure.

As shown in FIG. 14, each of the components 510-511 and 520-521 is divided into a region FR and a region FL, where the regions FR and FL each include one or more sub-patterns (discussed below in more detail below). In the illustrated embodiment, the FR regions in the components 510 and 511 are oriented perpendicular to the FR regions in the components 520-521. Likewise, the FL regions in the components 510 and 511 are oriented perpendicular to the FL regions in the components 520-521. The details of the region FR and the region FL is illustrated in FIGS. 15A-15B as examples. Specifically, FIG. 15A illustrates the fragmentary top views of an upper layer and a lower layer of the region FR (e.g., the region FR from the component 520), and FIG. 15B illustrates the fragmentary top views of an upper layer and a lower layer of the region FL (e.g., the region FL from the component 520).

Referring to FIG. 15A, the upper layer of the region FR includes a plurality of elongated gratings 530 and a plurality of sub-patterns 540. The elongated gratings may extend in the X-direction or in the Y-direction, depending on component of the overlay mark 500 in which they are located. In the illustrated embodiment, the gratings 530 located in the components 510-511 (for measuring X-direction overlay) extend in the Y-direction, and the gratings 530 located in the components 520-521 (for measuring Y-direction overlay) extend in the X-direction. For example, the gratings 530 in the FR region of the component 510 are perpendicular to the gratings 530 in the FR region of the component 520.

The sub-patterns 540 include patterns that are significantly smaller than the gratings 530 in size. In some embodiments, the difference in size between each of the gratings 530 and each of the sub-patterns 540 is at least one order of magnitude (e.g., ×10). The sub-patterns 540 are added to obtain focus information, as discussed in more detail below. In the embodiment illustrated in FIG. 15A, the sub-patterns 540 are divided into several subsets, where the sub-patterns 540 in each subset are arranged as a "column" that is located to the "right" (in the X-direction) of a respective one of the vertically-oriented gratings 530. It is understood that, for the FR region located in the components 520 or 521, the gratings 530 would be rotated 90 degrees so as to extend in the X-direction, and the sub-patterns 540 would be divided into subsets where each subset is arranged as a "row" that is located to the "top" or "bottom" (in the Y-direction) of a respective one of the horizontally-oriented gratings 530 in that case.

Still referring to FIG. 15A, the lower layer of the region FR includes a plurality of elongated gratings 550. The gratings 550 extend in the same direction in which the gratings 530 extend (e.g., the Y-direction in the components 510-511 and the X-direction in the components 520-521). However, there are no sub-patterns in the lower layer in this embodiment. It is understood, however, that in some other embodiments, the sub-patterns 540 may be located in the lower layer instead of the upper layer.

Referring now to FIG. 15B, the region FL shares many similarities with the region FR. For example, both the regions FR and FL include an upper layer and a lower layer. A plurality of elongated gratings 530 are implemented in the upper layer, and a plurality of elongated gratings 550 are implemented in the lower layer. In addition, for both the regions FR and FL, one of the layers (e.g., the upper layer herein) includes a plurality of sub-patterns 540, but the other layer (e.g., the lower layer herein) does not. Unlike the region FR, however, the sub-patterns 540 are located to the "left" (in the X-direction) of the gratings 530. Had the region FR been implemented in the components 520-521 (e.g., for measuring the Y-direction overlay), the sub-patterns 540 would be located to the "bottom" or "top" (in the Y-direction) of the gratings 530. In this manner, the regions FR and FL are symmetrical to one another.

Figure 16:
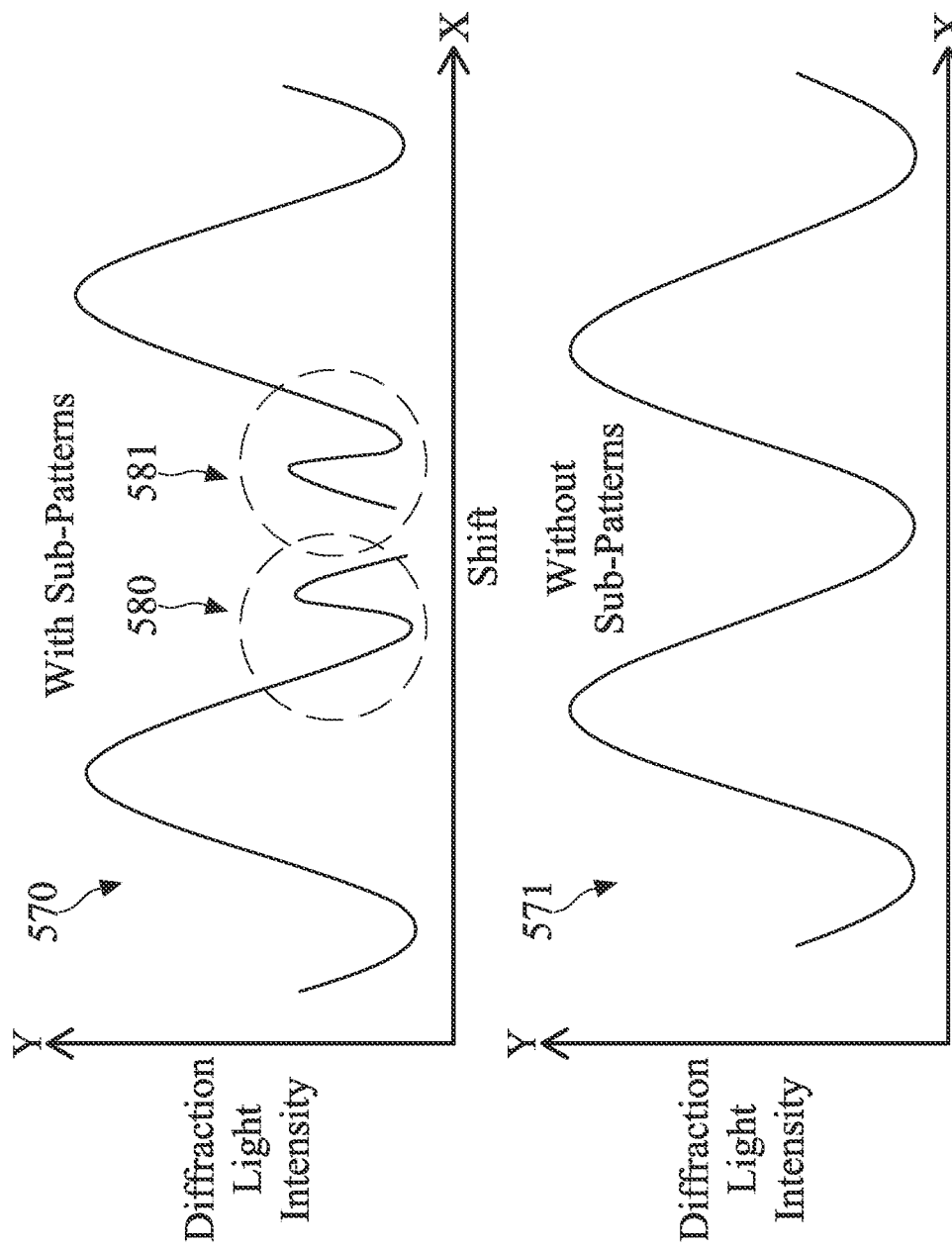
FIG. 16 illustrates different graphs that correspond to an overlay mark with sub-patterns and an overlay mark without sub-patterns, respectively, in accordance with some embodiments of the present disclosure.

The presence of the sub-patterns 540 in the regions FR or FL affects the diffraction intensity signal, such that a "side lobe" is manifested. This is illustrated in FIG. 16, which includes a graph 570 and a graph 571 that correspond to an overlay mark with the sub-patterns (such as the sub-patterns 540) and an overlay mark without the sub-patterns, respectively. In more detail, graph 570 and graph 571 each include an X-axis that represents a shift in position, which may include overlay and the built-in bias between an upper layer and a lower layer. Graph 570 and graph 571 also each include a Y-axis that represents a diffraction light intensity, which may correspond to the asymmetry between the $+1^{st}$ order diffracted light and the $-1^{st}$ order diffracted light. For example, the asymmetry may include the asymmetry information (denoted as $As=I_{+1}-I_{-1}$) discussed above.

Thus, the graphs 570 and 571 illustrate how the diffraction light intensity (e.g., $As=I_{+1}-I_{-1}$) varies as a function of a positional shift (which includes the overlay) between an upper layer and a lower layer of an overlay mark with the sub-patterns and an overlay mark without the sub-patterns, respectively. However, the presence of the sub-patterns (such as the sub-patterns 540 in FIGS. 15A-15B) leads to side-lobes in the graph 570, for example side-lobes 580 and 581. The side-lobes 580 and 581 manifest themselves as a "bump" or "protrusion" in what should otherwise be a smooth curve for the graph 570. In other words, the graph 570 would substantially resemble the graph 571, had the sub-patterns 540 not been implemented.

In some embodiments, the side-lobe 580 may be caused by the sub-patterns 540 from the region FR, and the side-lobe 581 may be caused by the sub-patterns 540 from the region FL. The side-lobes 580-581 are associated with focus information (focus of the exposure in a lithography process), and as such they may be used to determine what the optimal focus is for achieving good critical dimension. Since the side-lobes 580-581 are symmetrical with each other, they can be canceled out for purposes of determining overlay. In this manner, the overlay mark (such as the overlay mark 500) of the present disclosure may be used to obtain both overlay and focus information.

FIGS. 17A-17B illustrate fragmentary top views of portions of an overlay mark with sub-patterns according to embodiments of the present disclosure. Various parameters that may define the sub-patterns (e.g., the number and position of the sub-patterns) are also visually illustrated in FIGS. 17A-17B. In FIG. 17A, a plurality of rectangular sub-patterns 540 are implemented adjacent to the gratings 530. The number of the sub-patterns 540 is denoted by a parameter N, where N>=1.

The sub-patterns may also be implemented around the gratings 530 in more than one direction. For example, as shown in FIG. 17B, one or more sub-patterns 540A may be arranged to the "left" side of the grating 530. The parameter Nv>=1 indicates that there are 1 or more of the sub-patterns 540A in this region. The sub-patterns may be arranged as a single column/row, or an array with multiple columns and/or multiple rows. The parameter $I_v$ represents a distance between the grating 530 and the nearest one of the sub-patterns 540A. The parameter $P_v$ represents a pitch (e.g., a sum of a dimension of one of the sub-patterns and a distance between two of the adjacent sub-patterns 540A) of the sub-patterns 540A in the Y-direction. The parameter $P_{vh}$ represents another pitch of the sub-patterns in the X-direction, for example when there two or more columns (columns that extend in the Y-direction) of the sub-patterns 540A. The parameter $P_v$ is measured in the Y-direction, while the parameter $P_{vh}$ is measured in the X-direction.

Another group of the sub-patterns 540B are located "directly above" the grating 530 in the Y-direction. The parameter Nhh>=0 means that the number of the sub-patterns 540B in the "region above" the grating 530 may be 1 or more (if Nhh>0), or none at all (if Nhh=0). The parameter Inn represents a distance between the grating 530 and the nearest one of the sub-patterns 540B. The parameter $P_{hh}$ represents a pitch of the sub-patterns 540B in the Y-direction.

Another group of the sub-patterns 540C are located "directly below" the grating 530 in the Y-direction. The parameter Nhl>=0 means that the number of the sub-patterns 540C in the "region below" the grating 530 may be 1 or more (if Nhl>0), or none at all (if Nhl=0). The parameter $I_{hl}$ represents a distance between the grating 530 and the nearest one of the sub-patterns 540C. The parameter $P_{hl}$ represents a pitch of the sub-patterns 540C in the Y-direction.

Another group of the sub-patterns 540D are located "diagonally above" the grating 530 in the X-direction and in the Y-direction. The parameter Nch>=0 means that the number of the sub-patterns 540D in the "region diagonally above" the grating 530 may be 1 or more (if Nch>0), or none at all (if Nch=0). The parameter $I_{ch}$ represents a diagonal distance between the grating 530 and the nearest one of the sub-patterns 540D in the X and Y directions. The parameter $P_{ch}$ represents a diagonal pitch of the sub-patterns 540D in the X and Y directions. An angle $\theta_{ch}$ represents the diagonal angle of the sub-patterns 540D.

Another group of the sub-patterns 540E are located "diagonally below" the grating 530 in the X-direction and in the Y-direction. The parameter Ncl>=0 means that the number of the sub-patterns 540E in the "region diagonally below" the grating 530 may be 1 or more (if Ncl>0), or none at all (if Ncl=0). The parameter $I_{cl}$ represents a diagonal distance between the grating 530 and the nearest one of the sub-patterns 540E in the X and Y directions. The parameter $P_{cl}$ represents a diagonal pitch of the sub-patterns 540E in the X and Y directions. An angle $\theta_{cl}$ represents the diagonal angle of the sub-patterns 540E.

The configuration of the sub-patterns 540A-540E may be used to fine tune a lithography process window, for example the focus or exposure dose. The configuration of the sub-patterns 540A-540E may also be used to adjust the side-lobe effect discussed above and/or modify a Bossung curve discussed below.

Although the embodiments discussed above have shown the sub-patterns 540 as having somewhat rectangular top-view shapes, other designs are possible for the sub patterns. For example, referring to FIGS. 18A-18E, the top views of several example embodiments of the sub-patterns are illustrated.

In the embodiment shown in FIG. 18A, sub-patterns 540F are implemented adjacent to the gratings 530. In this embodiment, the sub-patterns 540F include five polygons. Each polygon has three or more sides (i.e., n>=3, where n is the side of the polygon). The number of sides of the polygon may be configured to adjust the side-lobe effect produced by the gratings diffraction. With different polygons, the overlay mark will produce slightly different depth of focus (DOF).

In the embodiment shown in FIG. 18B, sub-patterns 540G are implemented adjacent to the gratings 530. In this embodiment, the sub-patterns 540G include four circles or circular-shaped patterns. The sub-patterns 540G may also be referred to as point symmetry sub-patterns. The number, size, and/or location of the circular shaped sub-patterns 540G may be configured to adjust the side-lobe effect smoothly.

In the embodiment shown in FIG. 18C, sub-patterns 540H are implemented adjacent to the gratings 530. In this embodiment, the sub-patterns 540H include five ellipse-like patterns. The sub-patterns 540H may also be referred to as axis symmetry sub-patterns. The number, size, and/or location of the ellipse-like sub-patterns 540H may also be configured to adjust the side-lobe effect smoothly.

In the embodiment shown in FIG. 18D, sub-patterns 540I are implemented adjacent to the gratings 530. In this embodiment, the sub-patterns 540I are shaped as "lines", having top view shapes that are similar to the gratings 530. One or more of the "line-like" sub-patterns 540I may be implemented on either side of the grating 530. Parameters such as horizontal/vertical dimensions of each sub-pattern 540I, a spacing between the grating 530 and the nearest sub-pattern 540I, and/or a pitch of the sub-patterns 540I may be configured to adjust the side-lobe effect.

In the embodiment shown in FIG. 18E, combinations of different types of sub-patterns may be implemented adjacent to the gratings 530. For example, the line-like sub-patterns 540I may be implemented adjacent to the gratings 530, and the rectangular sub-patterns 540A may be implemented adjacent to the line-like sub-patterns 540I. In other embodiments, the sub-patterns 540A, 540F, 540G, 540H, 540I may be mixed into various different combinations and sub-combinations. In addition, any one of the shapes of the sub-patterns discussed herein may be used to implement the sub-patterns 540B-E that are disposed on different directions of the grating 530, as shown in FIG. 17B.

It is also understood that the shapes and profiles of the gratings and sub-patterns discussed above in the present disclosure may represent the design on a photomask. However, once these patterns are patterned onto a wafer, they may lose their resemblance to their original designs, due to optical effects. For example, patterns having rectangular or polygonal original designs may have more rounded or at least non-straight edges once they are patterned onto a wafer. Nonetheless, they may still cause the side-lobes discussed above, which will allow the overlay marks herein to be used to determine both overlay and focus.

Referring back to FIG. 14, the components 510-511 are each used to measure the X-direction overlay, and the components 520-521 are each used to measure Y-direction overlay. As such, the regions FR and FL in the components 510-511 are disposed adjacent to one another in the Y-direction, and the regions FR and FL in the components 520-521 are disposed adjacent to one another in the X-direction. Stated differently, for the components 510-511, the regions FR and FL share a border that extends in the X-direction, whereas for the components 520-521, the regions FR and FL share a border that extends in the Y-direction.

The region FR or the region FL in each of the components 510-511 or 520-521 may be configured to include the sub-patterns discussed above in FIG. 15A-15B, 17A-17B, or 18A-18E. Since the overlay measurement in the X-direction does not interfere with the overlay measurement in the Y-direction (and vice versa), the regions FR and FL in the components 510-511 may include different sub-patterns (or have different sub-pattern designs) than the regions FR and FL in the components 520-521, for example with respect to the sub-pattern's shape, size, number, and/or location.

Since the overlay mark 500 includes regions FR and FL for each of the components 510-511 and 520-521, the overlay mark allows more overlay measurements to be made. For example, using the overlay calculation equations discussed above with reference to FIG. 4, an overlay may be measured for the region FR, which may be expressed as OVL-FR herein, while another overlay may be measured for the region FL, which may be expressed as OVL-FL herein. The OVL-FR and OVL-FL correspond to overlay in the same direction. For example, OVL-FR and OVL-FL could be overlay in the X-direction overlay if the regions FR and FL are implemented in the components 510-511 of the overlay mark 500, or OVL-FR and OVL-FL could be overlay in the Y-direction overlay if the regions FR and FL are implemented in the components 520-521 of the overlay mark 500.

The overlay mark 500 can improve overlay measurement accuracy, since each component 510-511 and 520-521 of the overlay mark 500 can obtain two overlay measurements (for a total of 8 overlay measurements for each overlay mark 500), whereas overlay marks without the regions FR and FL typically make one overlay measurement per component (for a total of 4 overlay measurements for each overlay mark). In some embodiments, the overlay data OVL-FR and OVL-FL may be summed and then divided by 2 to obtain an average overlay, for each of the components 510-511 and 520-521. In other words, an average overlay measurement may be calculated as OVL=(OVL-FR+OVL-FL)/2.

Due to the implementation of the sub-patterns—which cause the side-lobes 580-581 shown in FIG. 16—focus is also correlated with overlay according to various aspects of the present disclosure. For example, focus may be correlated with a difference between the overlay obtained via the region FR (e.g., OVL-FR) and the overlay obtained via the region FL (e.g., OVL-FL). Mathematically, this may be expressed as follows:

$$\text{Focus} \propto (\text{OVL-F}_R - \text{OVL-F}_L)$$

In some embodiments, the correlative relationship between focus and overlay may be approximated by a linear equation, such as Focus=a*OVL+b, where a and b are constants. In other embodiments, the correlative relationship between focus and overlay may be expressed as a higher order equation (such as one that includes a polynomial). Regardless of the equation used to approximate the correlative relationship between focus and overlay, it is understood that once enough overlay samples are collected, the constants (such as a and b) in the equation may be solved. With this equation at hand, focus may be determined once overlay data is measured.

Figure 19:
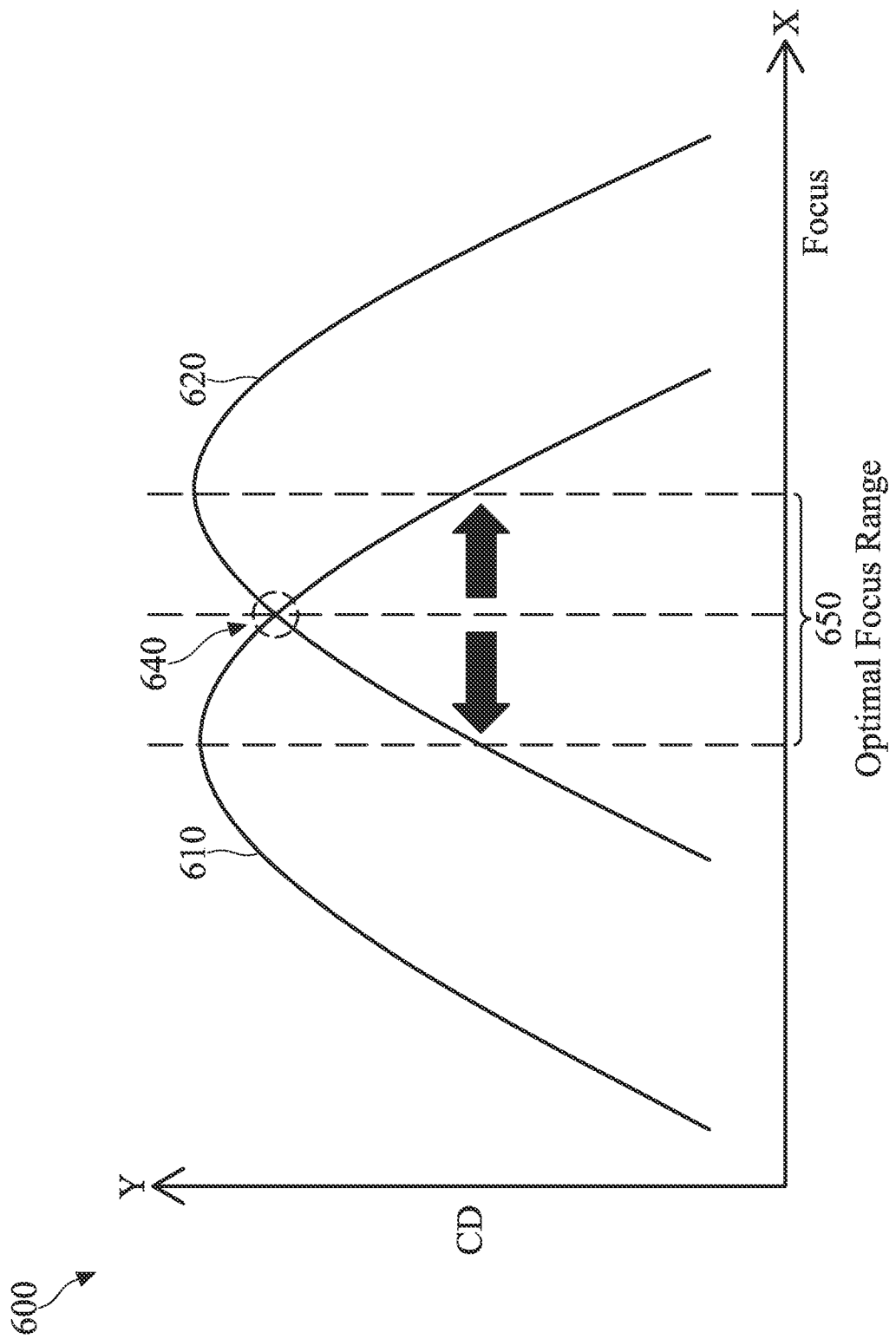
FIG. 19 illustrates a graph of critical dimension (CD) versus focus in accordance with some embodiments of the present disclosure.

FIG. 19 illustrates a graph 600 of critical dimension (CD) versus focus. For example, the X-axis of the graph 600 represents focus (e.g., focus length of an exposure process), and the Y-axis of the graph 600 represents the measured CD. In more detail, one or more test wafers may be used to produce the graph 600. A plurality of overlay marks similar to the overlay marks 500 may be implemented on the one or more test wafers. The focus (and/or exposure dose) that were used to fabricate these overlay marks may vary somewhat from one another. As discussed above, focus is correlated with overlay. Thus, the focus data associated with these different overlay marks on the wafer can be determined after the overlay data is obtained (e.g., via asymmetry light diffraction intensity as discussed above). The CD is measured corresponding to each sample data of focus.

Note that the graph 600 includes a curve 610 and a curve 620. These curves are referred to as "Bossung curves." The curve 610 corresponds to the measurements obtained via the components 510 and/or 511, whereas the curve 620 corresponds to the measurements obtained via the components 520 and/or 521. The curves 610 and 620 are displaced from one another in terms of focus. This displacement may be intentionally implemented by configuring the sub-patterns on the components 510-511 to be different from the patterns on the components 520-521, for example the size of the patterns or the density of the patterns. Since each unique design/arrangement of the sub-patterns corresponds to a unique curve, it follows that the differences between the component 510/511 and the component 520/521 (e.g., in terms of their sub-patterns) lead to the separation of the curves 610 and 620 in FIG. 19.

As shown in FIG. 19, the curves 610 and 620 may intersect at an intersection point 640. According to various aspects of the present disclosure, the focus corresponding to the intersection point 640 may represent an optimal focus. One reason for the intersection point 640 being the optimal focus is that, the intersection point 640 represents a focus that would simultaneously optimize the CD for both the curve 610 and the curve 620. Again, the curves 610 and 620 are obtained using the components 510 and 511 that measure the X-direction overlay and the Y-direction overlay, respectively. Therefore, optimizing the CD corresponding to both curves 610 and 620 represents the best CD uniformity performance for features on the wafer in both the X and Y directions. An optimal focus range 650 may also be obtained by expanding the optimal focus from the intersection point 640 in either direction along the X-axis in FIG. 19, until the focus values that correspond to the greatest CD values in the curves 610 and 620 are reached, respectively. This optimal focus range 650 may be used in future semiconductor fabrication to achieve optimized CD performance (e.g., with respect to CD uniformity).

Figures 20A, 20B:
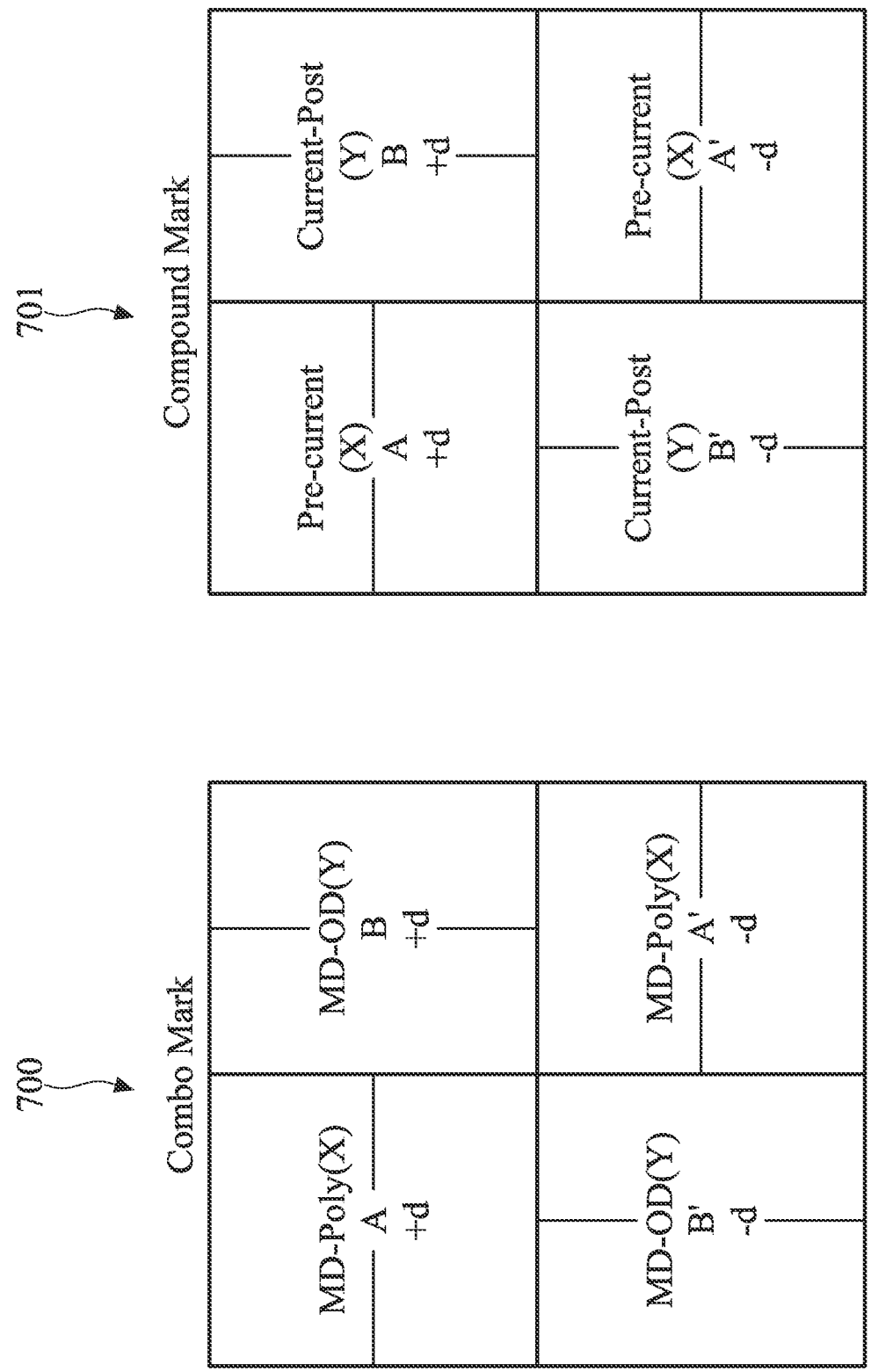
FIGS. 20A-20B illustrate a combo mark 700 and a compound mark 701, respectively, in accordance with some embodiments of the present disclosure.

FIGS. 20A-20B illustrate a combo mark 700 and a compound mark 701 according to embodiments of the present disclosure, respectively. The combo mark 700 and the compound mark 701 are different embodiments of an overlay mark. They may each be similar to the overlay mark 500 discussed above with reference to FIG. 14. However, the combo mark 700 and the compound mark 701 may each pertain to 3 or more layers. For example, the combo mark 700 and the compound mark 701 may each include four components A, A', and B, B', which may be similar to the components 510-511 and 520-521 discussed above. The difference between the components A and A' is that the component A corresponds to a +d shift/bias between its upper and lower layers, whereas the component A' corresponds to a −d shift/bias between its upper and lower layers. Similarly, the difference between the components B and B' is that the component B corresponds to a +d shift/bias between its upper and lower layers, whereas the component B' corresponds to a −d shift/bias between its upper and lower layers.

For the combo mark 700, the components A and A' are each configured to measure the overlay between a MD (e.g., Metal-zero) layer and a polysilicon layer. Since the alignment in the X-direction is of importance between the MD layer and the polysilicon layer, but their alignment in the Y-direction is not of concern, the components A and A' are each configured to measure the overlay in the X-direction, but not in the Y-direction. Meanwhile, the components B and B' are configured to measure the overlay between the MD layer and an OD (active region) layer. Since the alignment in the Y-direction is of importance between the MD layer and the active region OD, but their alignment in the X-direction is not of concern, the components B and B' are configured to measure the overlay in the Y-direction, but not in the X-direction.

The compound mark 701 shares many similarities with the combo mark 700, but with some minor differences. One difference is that the components A and A' in the compound mark 701 are configured to measure the overlay between a current layer and a pre-layer (e.g., below the current layer), and the components B and B' in the compound mark 701 are configured to measure the overlay between a current layer and a post-layer (e.g., above the current layer). The current layer, the pre-layer, and/or the post-layer discussed herein is not limited to the metal-zero layer, the polysilicon layer, or the active region OD layer, and they may be any layer in semiconductor fabrication.

It is also understood that the components A, A', B, and B' of the compound mark 701 are not restricted to measure overlay in just one direction. For example, two different embodiments of the compound mark 701 may both be implemented on a single wafer. In a first embodiment of the compound mark 701, its components A and A' are each configured to measure the X-direction overlay, while its components B and B' are each configured to measure the Y-direction overlay. In a second embodiment of the compound mark 701, its components A and A' are each configured to measure the Y-direction overlay, while its components B and B' are each configured to measure the X-direction overlay. As such, a plurality of compound marks 701 may be used to measure both the X-direction overlay and the Y-direction overlay between a current layer, a pre-layer below the current layer, and a post-layer above the current layer.

In addition to determining focus information, the overlay marks herein can also be used to determine CD information according to various aspects of the present disclosure. For example, referring now to FIGS. 21A-21C, an overlay mark 800 is illustrated. The overlay mark 800 is similar to the overlay mark 500 discussed above with reference to FIG. 14, as the overlay mark 800 also includes four components 810-811 and 820-821, which are similar to the components 510-511 and 520-521 of the overlay mark 500. Each of the components 810-811 and 820-821 also includes an FR region and a FL region, again similar to the FR and FL regions of the overlay mark 500 discussed above.

In the illustrated embodiment herein, FIG. 21A illustrates the top view of the configuration of the overlay mark 800 (e.g., with respect to its components 810-811 and 820-821, as well the FR and FL regions therein), FIG. 21B illustrates the top view of one of the layers of the component 810 (including its gratings 830 and sub-patterns 840), and FIG. 21C illustrates the top view of one of the layers of the component 820 (including its gratings 831 and sub-patterns 840) in the component 820. As discussed above, each of the components 810 and 820 may include an upper layer and a lower layer, where a bias/shift of +d or −d exists between the upper and lower layers. The sub-patterns 840 may be in one of the layers, but not necessarily in the other layer. In the embodiment shown in FIGS. 21B and 21C, the upper layers are illustrated for the components 810 and 820, and the sub-patterns 840 are located in the upper layers. However, it is understood that the sub-patterns 840 may be implemented in the lower layers in another embodiment.

As shown in FIG. 21A, the component 810 is perpendicularly oriented with respect to the component 820. This is illustrated in more detail in FIGS. 21B and 21C. For example, as shown in FIG. 21B that corresponds to the component 810, the gratings 830 each extend in the Y-direction, and the sub-patterns 840 are arranged into different columns that also each extend in the Y-direction. Meanwhile, as shown in FIG. 21C that corresponds to the component 820, the gratings 831 each extend in the X-direction, and the sub-patterns 840 are arranged into different row that also each extend in the X-direction.

As discussed above, in order to best extract focus information from the overlay mark 800, the sub-patterns 840 in FIG. 21B may be configured differently than the sub-patterns 840 in FIG. 21C, for example with respect to their numbers, shapes, sizes, etc. In addition, since the overlay mark 800 is used to extract CD information, the gratings 830 in FIG. 21B are configured differently than the gratings 831 in FIG. 21C as well. For example, the gratings 830 in FIG. 21B each have a width 835 measured in the X-direction, and the gratings 831 in FIG. 21C each have a width 836 measured in the Y-direction, where the width 835 is not equal to the width 836. In some embodiments, the width 835 may be substantially smaller than the width 836, for example at least 25% smaller in some embodiments, or at least 50% smaller in other embodiments. In other words, the gratings 831 in the component 820 are substantially "fatter" than the gratings 830 in the component 810. The difference in grating widths 835-836 between the gratings 830 and 831 means that the components 810 and 820 of the overlay mark 800 have different critical dimensions (CDs). In other words, the same overlay mark 800 may be configured such that different CDs exist.

While not specifically illustrated for reasons of simplicity, it is understood that the above discussions may also apply to the components 811 and 821. In other words, the component 811 may be substantially similar to the component 810, except that its upper and lower layers are shifted/biased in a different direction than the component 810. Likewise, the component 821 may be substantially similar to the component 820, except that its upper and lower layers are shifted/biased in a different direction than the component 820. As such, the component 821 may also have substantially "fatter" gratings than the component 811 (or than the component 810). Furthermore, it some other embodiments, the components 811 and 821 may also be configured such that their gratings may have different widths than the gratings 830 and 831 discussed above.

Figure 22:
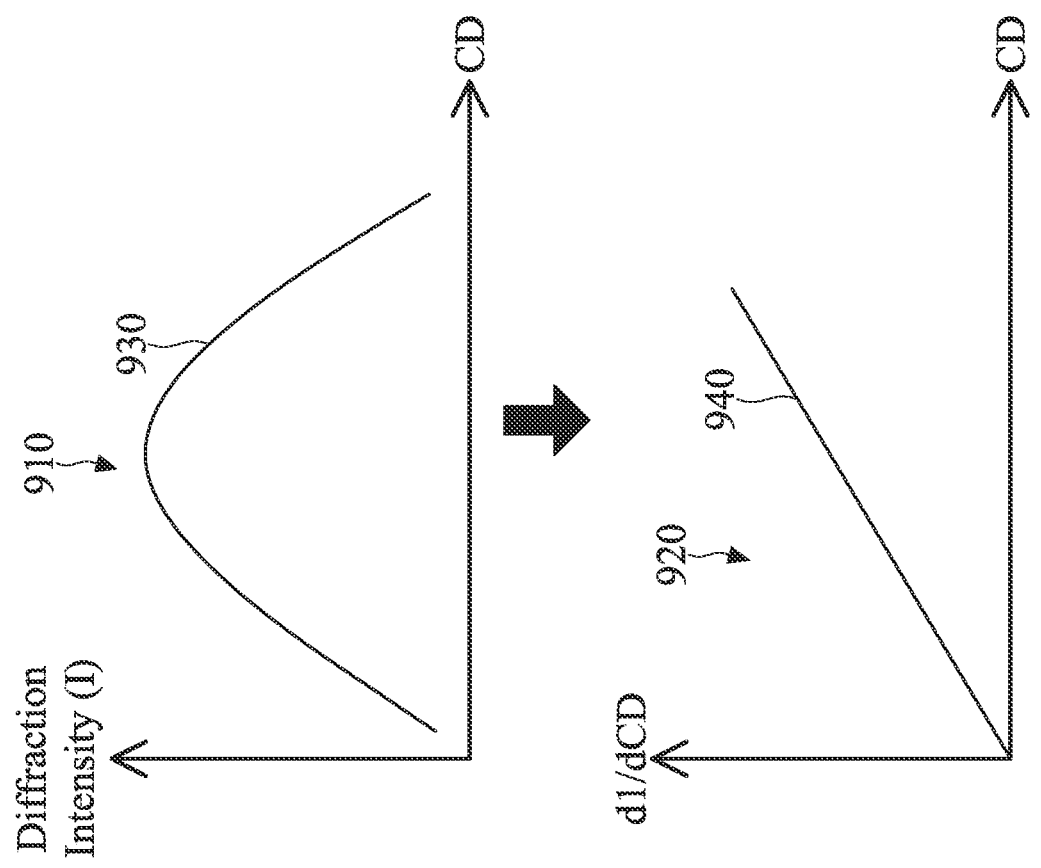
FIG. 22 illustrates graphs that indicate the correlation between diffraction light intensity and CD, in accordance with some embodiments of the present disclosure.

The difference in the grating sizes between the various components of the overlay mark 800 allows for the extraction of CD information. This is illustrated in FIG. 22, which shows a graph 910 and a graph 920. The graph 910 has an X-axis that represents the critical dimension (CD), as well as a Y-axis that represents diffraction intensity (I). The graph 910 contains a plot 930 that illustrates a relationship between the CD and diffraction intensity, i.e., how they each vary in relation with one another. The graph 920 has an X-axis that represents the critical dimension (CD), as well as a Y-axis that represents a derivative of diffraction intensity vs CD (dI/dCD). The graph 920 contains a plot 940 that illustrates a relationship between the CD and dI/dCD, i.e., how they each vary in relation with one another. In other words, the plot 940 may be a derivative of the plot 930, or stated differently, the plot 930 is an integral of the plot 940. It is understood that the plots 930 and 940 illustrated herein are merely for illustrative purposes, and that they may not be 100% mathematically accurate as drawn, or necessarily reflect the true behavior of the underlying variables that they represent.

As discussed above, the overlay mark 800 is configured to have different CDs (e.g., widths of the gratings for the various components of the overlay mark 800). The diffraction light intensity may be measured for each of the components of the overlay mark 800, and that yields to different points on the plot 930. It is understood that exposure energy is directly correlated with the diffraction light intensity. Thus, as exposure energy is varied, that may further change the relationship between the diffraction light intensity and CD, which may correspond to different points on the plot 930. This may be repeated for one or more overlay marks similar to the overlay mark 800 in order to gather a plurality of measurements. In some embodiments, the plot 940 is obtained first, for example by measuring CD and diffraction light intensity information using an SEM (scanning electron microscope) tool or an overlay measurement tool, and then the plot 930 is derived by taking an integral of the plot 940.

With the plot 930 available, CD predictions can be made. For example, the plots 930 and 940 may be generated or derived using one or more overlay marks 800 on a test wafer. After the plots 930 and 940 are made available, the CDs of features on subsequently fabricated wafers may be predicted by measuring the diffraction light intensity, for example using overlay marks on the subsequently fabricated wafers. Since the relationship between the diffraction light intensity and the CD is now known (e.g., based on the plot 930), the CD may be determined via the measurement of the diffraction light intensity. Accordingly, the overlay marks discussed herein can be used to not only measure overlay (which is the primary function of conventional overlay marks), but also to measure focus information, as well as critical dimension (CD) information.

Figure 23:
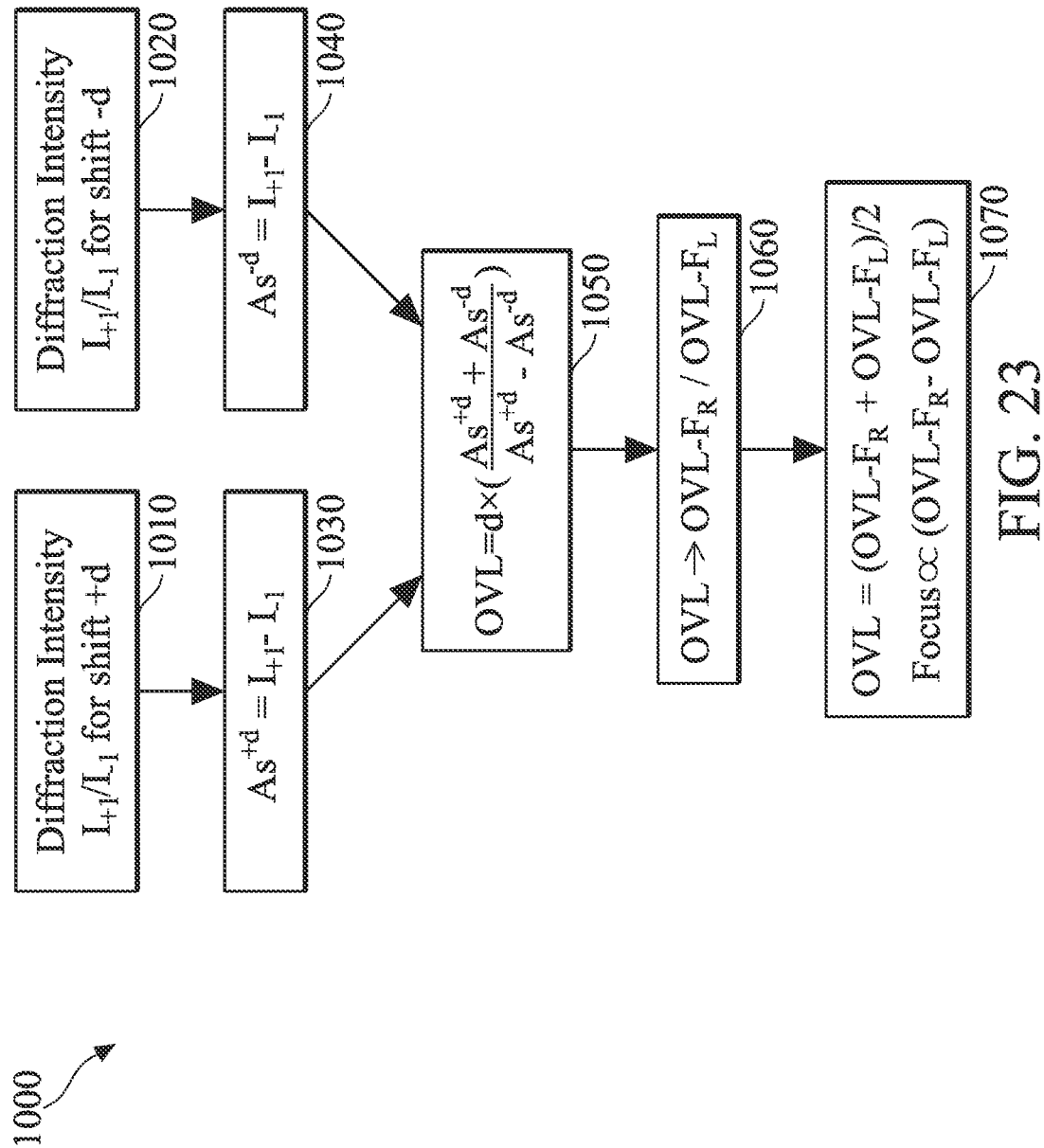

FIG. 23 illustrates a flowchart of a method 1000 of measuring focus using an overlay mark of the present disclosure. The overlay mark may be the overlay marks 200A-200D, 400A-400F, 500, 700-701, or 800 discussed above. The method 1000 includes a step 1010 and a step 1020, in which a diffraction light intensity is measured, for example in a manner similar to that discussed above with reference to FIG. 3. In both the steps 1010 and 1020, the diffraction light intensity is measured for the +1 order diffracted light (e.g., $I_{+1}$) and the $I_{-1}$ order diffracted light (e.g., $I_{-1}$). However, in step 1010, the diffraction light intensity is measured for a shift of +d between the upper and lower layers (e.g., as discussed above with reference to FIG. 4B), whereas in step 1020, the diffraction light intensity is measured for a shift of −d between the upper and lower layers (e.g., as discussed above with reference to FIG. 4A). For example, the step 1010 may be performed using the components of the overlay mark that have a +d bias between its upper and lower layers, as in the case for components 210 or 221 of the overlay mark 200A of FIG. 5, whereas the step 1020 may be performed using the components of the overlay mark that have a −d bias between its upper and lower layers, as in the case for components 220 or 211 of the overlay mark 200A of FIG. 5.

The method 1000 includes steps 1030 and 1040, in which asymmetry information is obtained. The step 1030 is performed after the step 1010, where the +1 order and −1 order diffraction light intensity (measured using the shift +d) are used to calculate the asymmetry in the case of a shift of +d, which is expressed as $As^{+d}=I_{+1}-I_{-1}$. The step 1040 is performed after the step 1020, where the +1 order and −1 order diffraction light intensity (measured using the shift −d) are used to calculate the asymmetry in the case of a shift of −d, which is expressed as $As^{-d}=I_{+1}-I_{-1}$.

The method 1000 then proceeds to step 1050, in which overlay is calculated based on the asymmetry information obtained in steps 1030 and 1040. In an embodiment, the overlay is calculated using the following equation:

$$OVL = d \times \left( \frac{As^{+d} + As^{-d}}{As^{+d} - As^{-d}} \right)$$

where OVL represents the calculated overlay, and d represents the magnitude of the shift or bias between the upper and lower layers of the overlay mark.

The method 1000 then proceeds to step 1060, in which the overlay is obtained for both the FR region and the FL region. As discussed above, the overlay marks 500 or 800 each have a plurality of components, where each component has an FR region and an FL region that is symmetrical to the FR region (see FIGS. 15A-15B, for example). The overlay for the FR region may be measured in accordance to steps 1010-1050 discussed above, and then the same procedure is repeated for the FL region. The overlay corresponding to the FR region may be represented in FIG. 23 as OVL-$F_R$, and the overlay corresponding to the FL region may be represented in FIG. 23 as OVL-$F_L$. Thus, at the end of step 1060, two overlay measurements are obtained: one for the FR region, and the other one for the FL region.

The method 1000 then proceeds to step 1070, in which the two overlay measurements OVL-$F_R$ and OVL-$F_L$ are averaged together to obtain a more accurate overlay. The step 1070 also extracts focus information from the two overlay measurements OVL-$F_R$ and OVL-$F_L$. As discussed above with reference to FIG. 16, focus is also correlated with a difference between the FR region overlay and the FL region overlay, and it can be mathematically expressed as:

Focus∝(OVL-$F_R$−OVL-$F_L$)

In this manner, the overlay marks of the present disclosure can be used not to only measure overlay, they can also be used to extract focus information by performing the steps 1010-1070 of FIG. 23.

Figure 24:
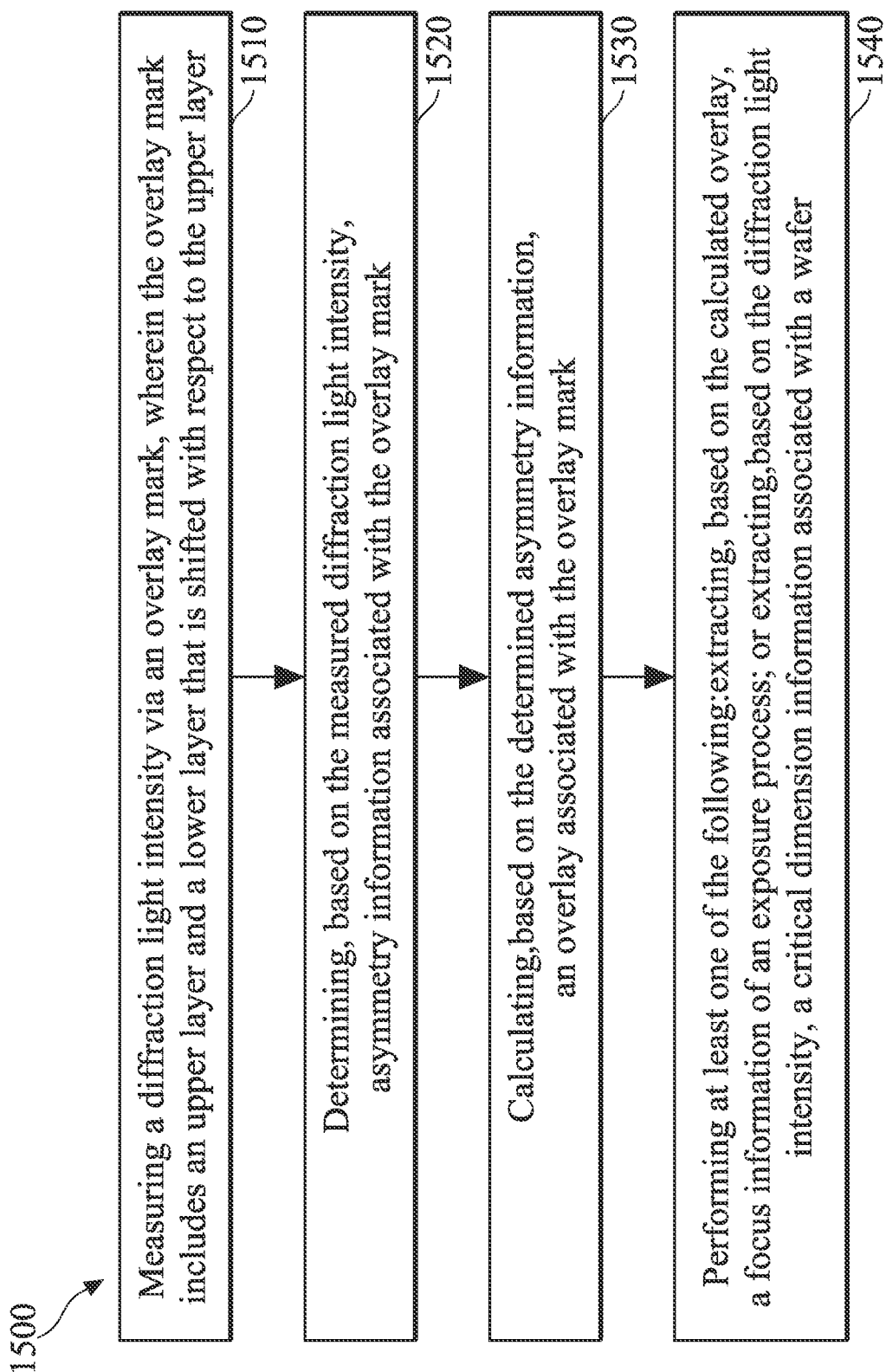

FIG. 24 is a flowchart of a method 1500 of using an overlay mark in accordance with some embodiments of the present disclosure.

The method 1500 includes a step 1510 of measuring a diffraction light intensity via an overlay mark. The overlay mark includes an upper layer and a lower layer that is shifted with respect to the upper layer.

The method 1500 includes a step 1520 of determining, based on the measured diffraction light intensity, asymmetry information associated with the overlay mark.

The method 1500 includes a step 1530 of calculating, based on the determined asymmetry information, an overlay associated with the overlay mark.

The method 1500 includes a step 1540 of performing at least one of the following: extracting, based on the calculated overlay, a focus information of an exposure process; or extracting, based on the diffraction light intensity, a critical dimension information associated with a wafer.

In some embodiments, the extracting of the focus information comprises determining an optimal focus range for performing the exposure process. In some embodiments, the extracting of the critical dimension information comprises determining a relationship between a diffraction light intensity and critical dimension. In some embodiments, the steps 1510-1540 are performed on a test wafer, rather than on a production wafer.

It is understood that additional processes may be performed before, during, or after the steps 1510-1540 of the method 1500. For example, the method 1500 may include a step of fabricating the overlay mark (or a plurality of similar overlay marks) on a wafer, such as a test wafer. The overlay mark may be fabricated before the step 1510 of measuring the diffraction light intensity. For reasons of simplicity, additional steps are not discussed herein in detail.

Figure 25:
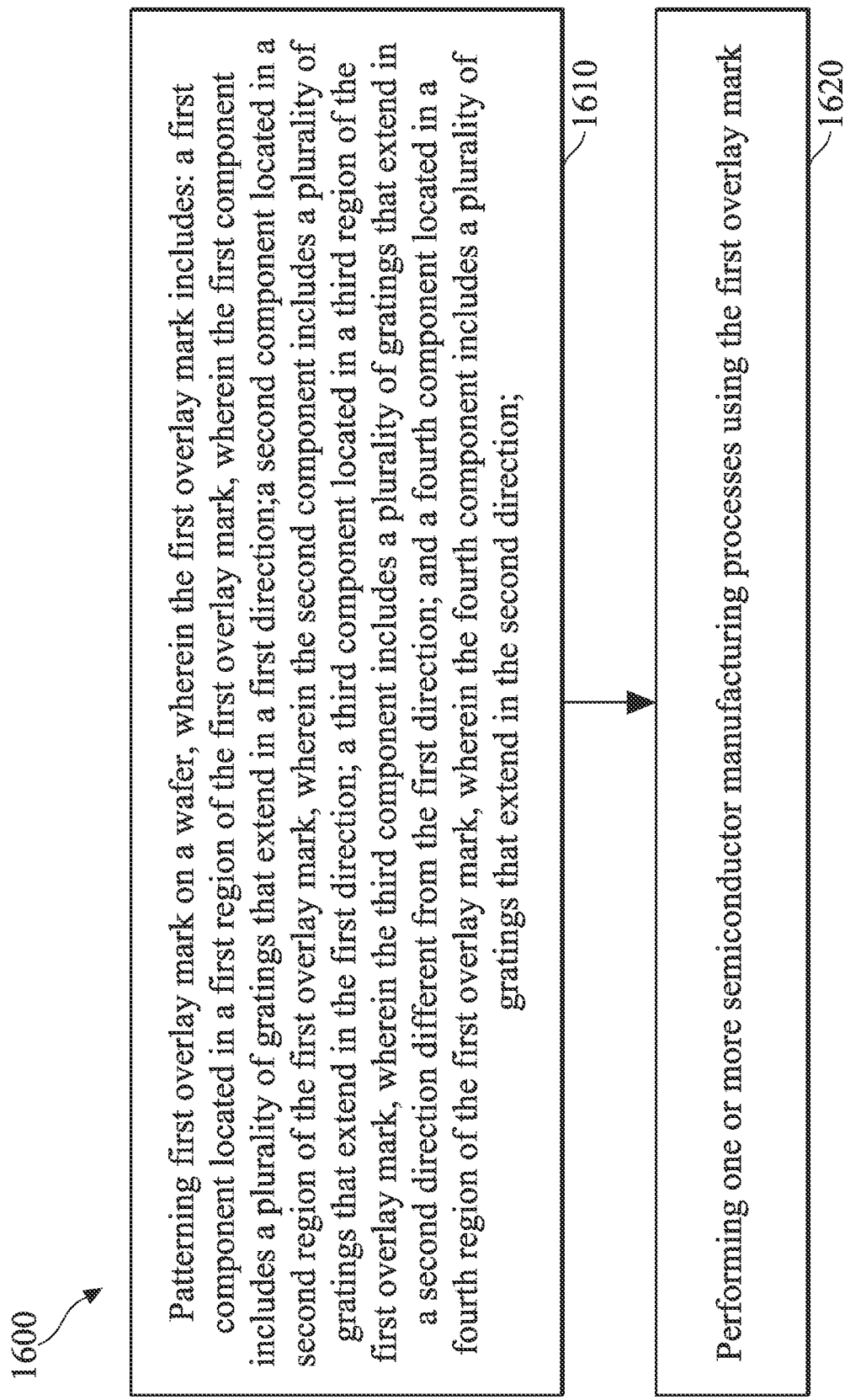

FIG. 25 is a flowchart illustrating a method 1600 of semiconductor fabrication according to aspects of the present disclosure. The method 1600 includes a step 1610 of patterning a first overlay mark on a wafer. The first overlay mark includes: a first component located in a first region of the first overlay mark, wherein the first component includes a plurality of gratings that extend in a first direction; a second component located in a second region of the first overlay mark, wherein the second component includes a plurality of gratings that extend in the first direction; a third component located in a third region of the first overlay mark, wherein the third component includes a plurality of gratings that extend in a second direction different from the first direction; and a fourth component located in a fourth region of the first overlay mark, wherein the fourth component includes a plurality of gratings that extend in the second direction; wherein: the first region is aligned with the second region; and the third region is aligned with the fourth region. The method 1600 further includes a step 1620 of performing one or more semiconductor manufacturing processes using the first overlay mark.

In some embodiments, the first component, the second component, the third component, and the fourth component each include an upper layer in which a first subset of the gratings are located and a lower layer in which a second subset of the gratings are located.

In some embodiments, for the first component, the first subset of the gratings are shifted with respect to the second subset of the gratings by a distance +d in the second direction; for the second component, the first subset of the gratings are shifted with respect to the second subset of the gratings by a distance −d in the second direction; for the third component, the first subset of the gratings are shifted with respect to the second subset of the gratings by a distance −d in the first direction; and for the fourth component, the first subset of the gratings are shifted with respect to the second subset of the gratings by a distance +d in the first direction.

In some embodiments, the first region, the second region, the third region, and the fourth region correspond to four corner regions of a square.

In some embodiments, at least a portion of the first overlay mark is located adjacent to an edge of an integrated circuit chip or an edge of a test line.

In some embodiments, the first overlay mark is a part of an apparatus that further includes a pattern that includes at least a portion of an integrated circuit chip, wherein the first overlay mark is disposed adjacent to a border of the pattern. In some embodiments, the apparatus further includes a second overlay mark that is disposed adjacent to a corner of the pattern, wherein the second overlay mark is configured differently from the first overlay mark. In some embodiments, the second overlay mark includes: a first component located in a first region of the second overlay mark, wherein the first component includes a plurality of gratings that extend in the first direction; a second component located in a second region of the second overlay mark, wherein the second component includes a plurality of gratings that extend in the first direction, and wherein the first region and the second region are diagonally disposed with respect to one another; a third component and a fourth component collectively located in a third region of the second overlay mark and share a border that extends in the first direction, wherein the third component and the fourth component each include a plurality of gratings that extend in the second direction; and a fifth component and a sixth component collectively located in a fourth region of the second overlay mark and share a border that extends diagonally in both the first direction and the first direction, wherein the third region and the fourth region are diagonally disposed with respect to one another, and wherein the fifth component and the sixth component each include a plurality of gratings that extend in the second direction. In some embodiments, the third component, the fourth component, the fifth component, and the sixth component each include an upper layer in which a first subset of the gratings are located and a lower layer in which a second subset of the gratings are located; for the third component, the first subset of the gratings are shifted with respect to the second subset of the gratings by a distance +d in the first direction; for the fourth component, the first subset of the gratings are shifted with respect to the second subset of the gratings by a distance −d in the first direction; for the fifth component, the first subset of the gratings are shifted with respect to the second subset of the gratings by a distance +d in the first direction; and for the sixth component, the first subset of the gratings are shifted with respect to the second subset of the gratings by a distance −d in the first direction.

It is understood that additional processes may be performed before, during, or after the steps 1610-1620 of the method 1600. For reasons of simplicity, additional steps are not discussed herein in detail.

FIG. 26 is a flowchart illustrating a method 1700 of semiconductor fabrication according to aspects of the present disclosure. The method 1700 includes a step 1710 of patterning an overlay mark on a wafer. The overlay mark includes: a plurality of first gratings disposed in a first layer of the overlay mark; a plurality of second gratings disposed in a second layer of the overlay mark, wherein one of the first layer and the second layer includes an upper layer, and another one of the first layer and the second layer includes a lower layer disposed below the upper layer; and a plurality of sub-patterns disposed in the first layer, but not in the second layer, wherein a size of each of the first gratings is at least an order of magnitude larger than each of the sub-patterns. The method 1700 further includes a step 1720 of performing one or more semiconductor manufacturing processes using the overlay mark.

In some embodiments, the first gratings and the second gratings each extend in a first direction; and the first gratings are shifted with respect to the second gratings in a second direction that is different from the first direction.

In some embodiments, the first gratings, the second gratings, and the sub-patterns are located in a first region of the overlay mark; and the overlay mark includes a second region that is symmetrical to the first region. In some embodiments, the overlay mark include a first component and a second component; the first region and the second region are included in both the first component and the second component; the first region in the first component is oriented perpendicularly to the first region in the second component; and the second region in the first component is oriented perpendicularly to the second region in the second component. In some embodiments, the first component is configured to measure an X-direction overlay between a first layer and a second layer of a semiconductor device; and the second component is configured to measure a Y-direction overlay between the first layer and a third layer of the semiconductor device. In some embodiments, the sub-patterns in the first component are configured differently from the sub-patterns in the second component. In some embodiments, the first gratings in the first component and the first gratings in the second component have different widths.

In some embodiments, the sub-patterns are arranged into a row or a column that extends in a same direction as each of the first gratings.

In some embodiments, the sub-patterns include at least a first subset of sub-patterns and a second subset of sub-patterns; and the sub-patterns in the first subset have different top view profiles than the sub-patterns in the second subset.

It is understood that additional processes may be performed before, during, or after the steps 1710-1720 of the method 1700. For reasons of simplicity, additional steps are not discussed herein in detail.

Figure 27:
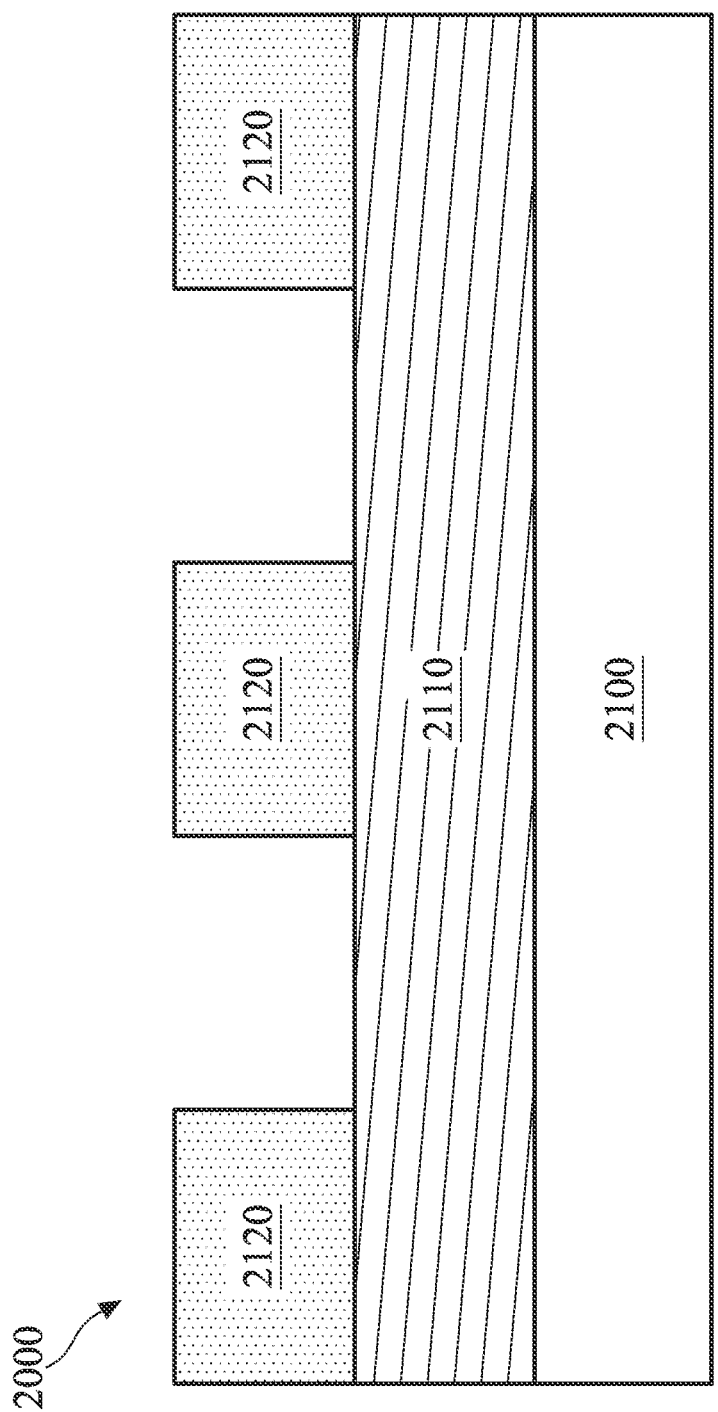
FIGS. 27-32 illustrate cross-sectional side views of a device at various stages of fabrication according to embodiments of the present disclosure.

FIGS. 27-32 illustrate diagrammatic cross-sectional side views of a device 2000 at different stages of fabrication according to embodiments of the present disclosure. The device 2000 may include an overlay mark according to the various aspects of the present disclosure discussed above. Referring now to FIG. 27, a wafer 2100 is provided. For example, the wafer 2100 may include a silicon substrate in some embodiments, or it may include another semiconductor or dielectric material in other embodiments. A layer 2110 is formed over the wafer 2100. The layer 2110 includes a material that can be patterned, for example a dielectric material or a metal material. A patterned layer 2120 is then formed over the layer 2110. In some embodiments, the patterned layer 2120 is a patterned photoresist layer, which may be patterned by a first photomask. In other words, the patterned layer 2120 is defined by a first photomask.

Figure 28:
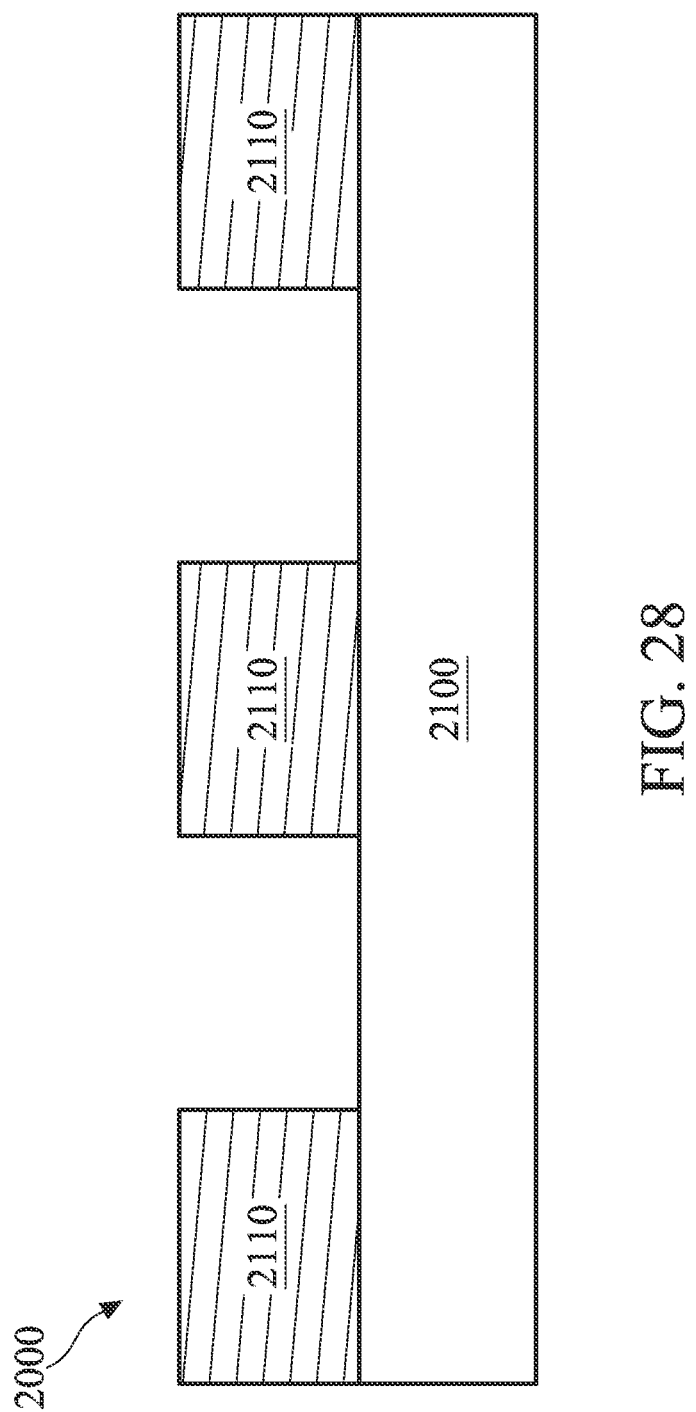

Referring now to FIG. 28, an etching process is performed to the device 2000 using the patterned photoresist layer 2120 as a mask. As a result of the etching process, the layer 2110 is etched to assume the top view pattern/shape of the patterned photoresist layer 2120. The patterned layer 2110 may serve as the lower layer of the various overlay mark of the present disclosure discussed above.

Figure 29:
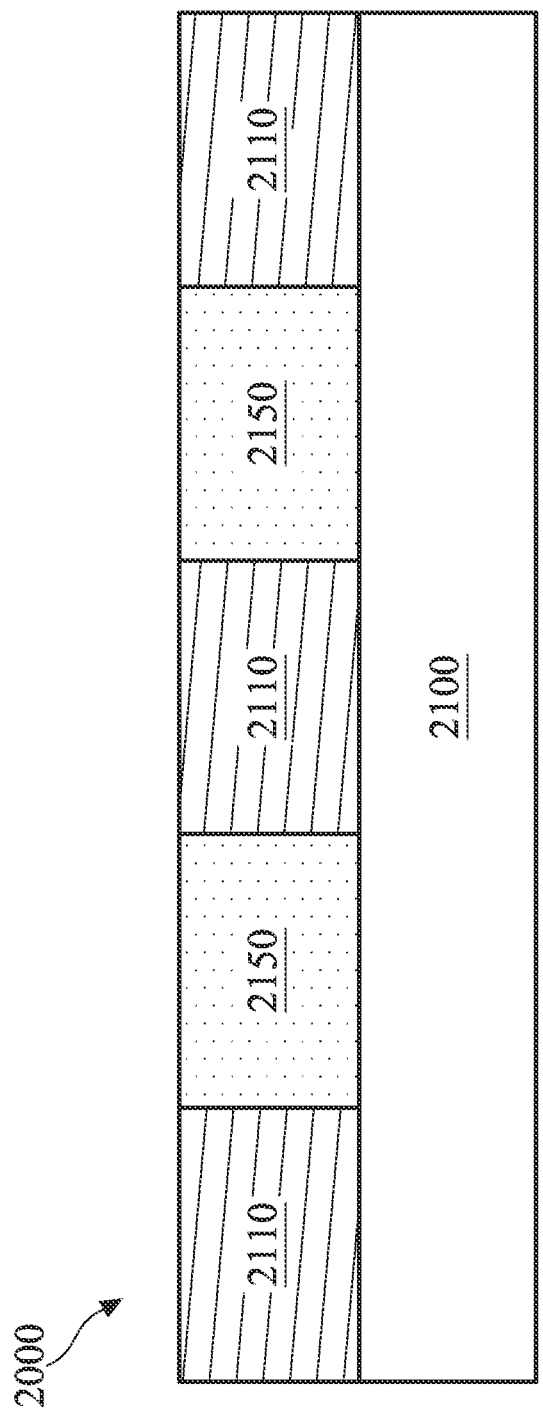

Referring now to FIG. 29, a layer 2150 is formed in the openings defined by the patterned layer 2110. A polishing process such as a chemical mechanical polishing (CMP) process is then performed to planarize the upper surfaces of the patterned layer 2110 and the layer 2150. The layer 2150 includes a different material from the layer 2110.

Figure 30:
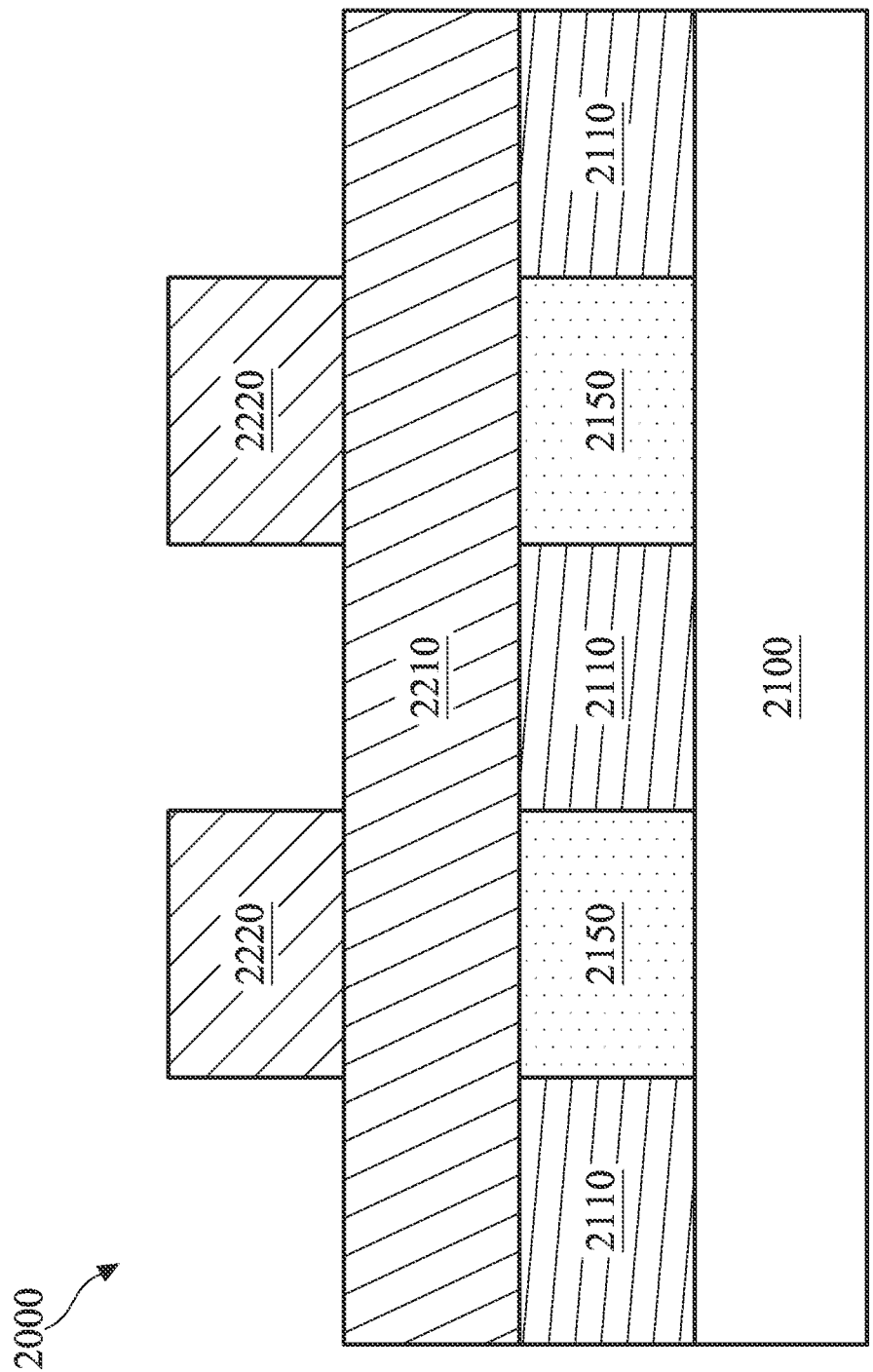

Referring now to FIG. 30, a layer 2210 is formed over the planarized upper surfaces of the layers 2110 and 2150. The layer 2210 includes a material that can be patterned, for example a dielectric material or a metal material. A patterned layer 2220 is then formed over the layer 2210. In some embodiments, the patterned layer 2220 is a patterned photoresist layer, which may be patterned by a second photomask different from the first photomask (used to pattern the layer 2110). In other words, the patterned layer 2220 is defined by a second photomask. In some embodiments, the patterned layer 2220 may correspond to the upper layer 100A discussed above with reference to FIG. 3. For example, the patterned layer 2220 may be used to measure overlay with the layer 2110, and if the measured overlay is not satisfactory, then the patterned layer 2220 may be removed and replaced by another patterned layer to improve overlay.

Figure 31:
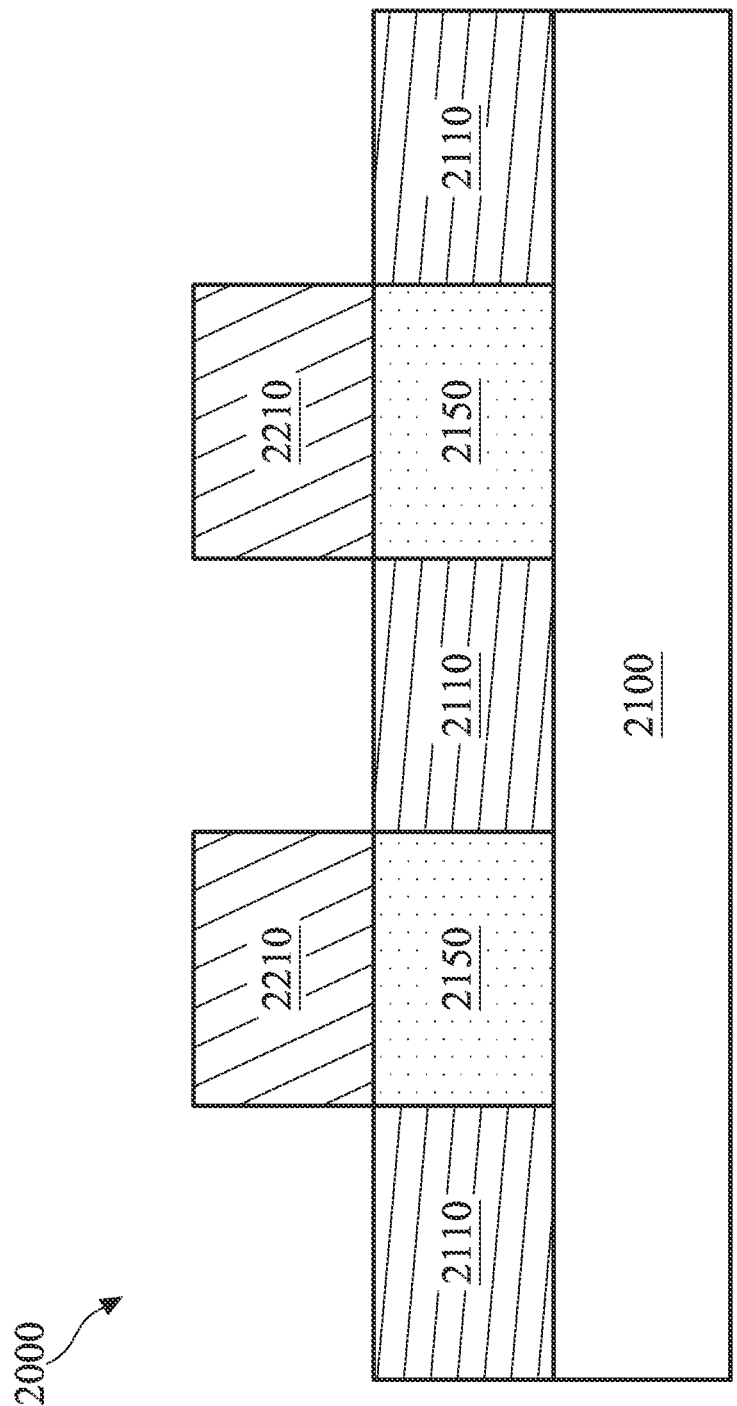

Referring now to FIG. 31, an etching process is performed to the device 2000 using the patterned photoresist layer 2220 as a mask. As a result of the etching process, the layer 2210 is etched to assume the top view pattern/shape of the patterned photoresist layer 2220. The patterned layer 2210 may serve as the upper layer of the various overlay mark of the present disclosure discussed above. The patterned layer 2210 and the patterned layer 2110 may also be used similar to the upper and lower layers in FIG. 3 to measure overlay.

Figure 32:
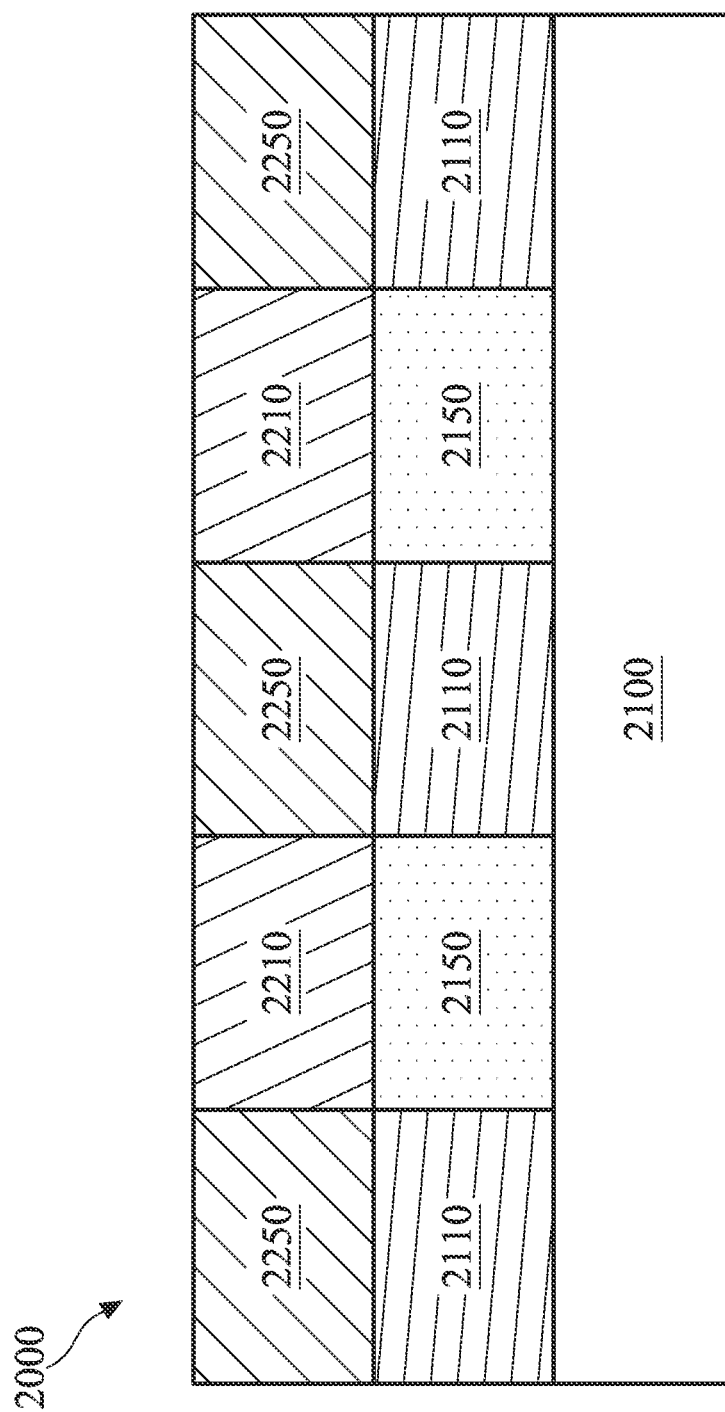

Referring now to FIG. 32, a layer 2250 is formed in the openings defined by the patterned layer 2210. A polishing process such as a CMP process is then performed to planarize the upper surfaces of the patterned layer 2210 and the layer 2250. The layer 2250 includes a different material from the layer 2210. In some embodiments, the layers 2150 and 2250 have the same material composition.

As this point, a dual-layered overlay mark is formed. Again, the upper layer of the overlay mark is represented by the layer 2210, while the lower layer of the overlay mark is represented by the layer 2110. It is understood, however, that the overlay mark shown in FIG. 32 is simplified for ease of understanding. The layers 2210 and 2110 may each include a plurality of patterns arranged in the manner described above with reference to FIGS. 3-21, as well having a bias (e.g., +d or −d) in a given direction, as discussed above. In addition, it is understood that other functional circuit components (e.g., metal lines or vias) may be patterned in the same layers as in the layers 2210 and 2110 of the overlay mark. The overlay measured between the layers 2210 and 2110 may indicate a degree of alignment between the functional circuit components.

The overlay marks discussed herein may remain even after all the fabrication processes have been performed, and the wafer has been diced and packaged into a plurality of IC chips. In other words, the overlay marks of the present disclosure may appear or be detected in an IC chip.

In semiconductor fabrication, the overlay marks of the present disclosure may be used to measure the alignment between different layers. The degree of alignment between the upper and lower layers of the overlay mark represents the alignment between other patterns formed in the same layers as the upper and lower layers of the overlay mark, respectively. In some embodiments, the diffracted light intensities of the gratings in an overlay mark may be used to calculated the asymmetry information in order to calculate the alignment or overlay, for example in a manner similar to that discussed above with reference to FIG. 3.

It is understood that while the overlay marks discussed above may be used in EUV lithography processes to measure alignment between different layers in some embodiments, they are not limited to EUV lithography and may be used in non-EUV lithography in other embodiments.

Based on the above discussions, it can be seen that the present disclosure offers advantages over conventional methods. It is understood, however, that other embodiments may offer additional advantages, and not all advantages are necessarily disclosed herein, and that no particular advantage is required for all embodiments. One advantage is that the overlay marks of the present disclosure allow for more accurate overlay measurements to be made. For example, the configuration of the overlay marks discussed above in association with FIGS. 5-13 can reduce the effects of noise generated as a result of poor pattern density uniformity. Another advantage is that the overlay marks of the present disclosure allow for the extraction of focus information. For example, sub-patterns (e.g., the sub-patterns shown in FIGS. 15A-15B, 17A-17B, and 18A-18E) are added to overlay marks, which lead to the side lobes discussed above in FIG. 16. The side lobes allow focus information to be extracted while not affecting overlay measurements. An optimal focus range may be determined, for example as discussed above with reference to FIG. 19. Yet another advantage is that the overlay marks of the present disclosure allows for the extraction of critical dimension (CD) information. For example, as discussed above with reference to FIGS. 21A-21C, the components of the overlay mark are configured to have different grating widths (i.e., different critical dimensions) to extract critical dimension information. In some embodiments, the extracted critical dimension information may include a relationship between critical dimension and diffraction light intensity (or exposure energy).

One embodiment of the present disclosure pertains to an apparatus. The apparatus includes an overlay mark. The overlay mark includes: a first component located in a first region of the first overlay mark, wherein the first component includes a plurality of gratings that extend in a first direction; a second component located in a second region of the first overlay mark, wherein the second component includes a plurality of gratings that extend in the first direction; a third component located in a third region of the first overlay mark, wherein the third component includes a plurality of gratings that extend in a second direction different from the first direction; and a fourth component located in a fourth region of the first overlay mark, wherein the fourth component includes a plurality of gratings that extend in the second direction. The first region is aligned with the second region. The third region is aligned with the fourth region.

Another embodiment of the present disclosure pertains to a method of fabricating a semiconductor device. An overlay mark is patterned on a wafer. The overlay mark includes: a plurality of first gratings disposed in a first layer of the overlay mark; a plurality of second gratings disposed in a second layer of the overlay mark, wherein one of the first layer and the second layer includes an upper layer, and another one of the first layer and the second layer includes a lower layer disposed below the upper layer; and a plurality of sub-patterns disposed in the first layer, but not in the second layer, wherein a size of each of the first gratings is at least an order of magnitude larger than each of the sub-patterns; and performing one or more semiconductor fabrication processes using the overlay mark.

Yet another embodiment of the present disclosure pertains to a method. The method includes: measuring a diffraction light intensity via an overlay mark, wherein the overlay mark includes an upper layer and a lower layer that is shifted with respect to the upper layer; determining, based on the measured diffraction light intensity, asymmetry information associated with the overlay mark; calculating, based on the determined asymmetry information, an overlay associated with the overlay mark; and performing at least one of the following: extracting, based on the calculated overlay, a focus information of an exposure process; or extracting, based on the diffraction light intensity, a critical dimension information associated with a wafer.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:
1. A structure, comprising:
   a pattern of a portion of an integrated circuit (IC); and a plurality of marks disposed around the pattern in a top view;

wherein:

each of the marks includes a plurality of gratings;

a first subset of the gratings each extend in a first direction in the top view; and a second subset of the gratings each extend in a second direction in the top view, the second direction being different from the first direction.

2. The structure of claim 1, wherein the first direction is perpendicular to the second direction.

3. The structure of claim 1, wherein the marks include overlay marks.

4. The structure of claim 1, wherein:

the marks include a first subset of marks and a second subset of marks;

each mark of the first subset of marks is disposed adjacent to a different edge of the pattern, respectively;

each mark of the second subset of the marks is disposed adjacent to a different corner of the pattern, respectively; and the gratings in the first subset of marks are arranged differently than the gratings in the second subset of the marks.

5. The structure of claim 4, wherein:

each of the marks in the first subset includes a first region, a second region, a third region, and a fourth region;

the first region and the second region are disposed adjacent to one another in the first direction in the top view;

the third region and the fourth region are disposed adjacent to one another in the first direction in the top view; and the first region and the second region are disposed closer to the pattern than the third region and the fourth region in the top view.

6. The structure of claim 5, wherein:

the gratings in the first region and the second region each extends in the first direction in the top view; and the gratings in the third region and the fourth region each extends in the second direction in the top view.

7. The structure of claim 4, wherein:

each of the marks in the second subset includes a first region, a second region, a third region, and a fourth region;

the first region and the second region are disposed adjacent to one another in the first direction in the top view;

the third region and the fourth region are disposed adjacent to one another in the first direction in the top view; and the first region and the second region are disposed closer to the pattern than the third region and the fourth region in the top view.

8. The structure of claim 7, wherein:

the gratings in the first region and the third region each extends in the first direction in the top view; and the gratings in the second region and the fourth region each extends in the second direction in the top view.

9. The structure of claim 1, wherein:

at least some of the marks each have a first layer and a second layer;

the first layer is disposed above or below the second layer;

the first layer and the second layer are each divided into a first component and a second component;

for the first layer, the gratings in the first component are shifted with respect to the gratings in the second component; and for the second layer, the gratings in the first component are unshifted with respect to the gratings in the second component.

10. The structure of claim 9, wherein the gratings in the first layer are shifted with respect to the gratings in the second layer.

11. The structure of claim 9, wherein the first component and the second component share a border than extends in either the first direction or in the second direction.

12. The structure of claim 9, wherein the first component and the second component share a border than extends in both the first direction and the second direction.

13. A structure, comprising:

a pattern of a portion of an integrated circuit (IC);

a first overlay mark disposed next to an edge of the pattern in a top view; and a second overlay mark disposed next to a corner of the pattern in a top view;

wherein:

the first overlay mark includes a plurality of first gratings arranged according to a first configuration; and the second overlay mark includes a plurality of second gratings arranged according to a second configuration different from the first configuration.

14. The structure of claim 13, wherein:

the first overlay mark and the second overlay mark each includes a first quadrant, a second quadrant, a third quadrant, and a fourth quadrant;

the first quadrant and the second quadrant share a first border than extends in a first direction in the top view;

the third quadrant and the fourth quadrant share a second border than extends in the first direction in the top view;

the first quadrant and the second quadrant collectively share a third border with the third quadrant and the fourth quadrant collectively, the third border extending in a second direction perpendicular to the first direction in the top view; and in at least one of the first, second, third, or fourth quadrants, the first gratings and the second gratings extend in different directions.

15. The structure of claim 13, wherein:

the first overlay mark or the second overlay mark includes an upper layer and a lower layer; and the first gratings or the second gratings in the upper layer are offset with respect to the first gratings or the second gratings in the lower layer.

16. The structure of claim 15, wherein:

the upper layer includes a first region and a second region; and the first gratings or the second gratings in the first region are offset with respect to the first gratings or the second gratings in the second region.

17. A structure, comprising:

a first pattern of a portion of an integrated circuit (IC);

a second pattern that includes a plurality of first gratings; and a third pattern that includes a plurality of second gratings;

wherein:

the first gratings form a first top view profile for the second pattern;

the second gratings form a second top view profile for the third pattern; and the first top view profile is different from the second top view profile.

18. The structure of claim 17, wherein:

the second pattern includes a first region, a second region, a third region, and a fourth region;

the first region and the third region are diagonally disposed with respect to one another;
the second region and the fourth region are diagonally disposed with respect to one another;
the first gratings in the first region and the second region extend in a same direction in a top view;
the first gratings in the first region and the third region extend in different directions in the top view;
the third pattern includes a fifth region, a sixth region, a seventh region, and an eighth region;
the fifth region and the seventh region are diagonally disposed with respect to one another;
the sixth region and the eighth region are diagonally disposed with respect to one another;
the second gratings in the fifth region and the seventh region extend in the same direction in a top view; and
the second gratings in the fifth region and the sixth region extend in different directions in the top view.

19. The structure of claim 18, wherein the second pattern is disposed closer to the first pattern than the third pattern.

20. The structure of claim 17, wherein the second pattern is a first overlay mark and the third pattern is a second overlay mark.

\* \* \* \* \*